(12) United States Patent
Sumita

(10) Patent No.: US 6,885,595 B2
(45) Date of Patent: Apr. 26, 2005

(54) MEMORY DEVICE

(75) Inventor: Masaya Sumita, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 5 days.

(21) Appl. No.: 10/660,632

(22) Filed: Sep. 12, 2003

(65) Prior Publication Data

US 2004/0062089 A1 Apr. 1, 2004

(30) Foreign Application Priority Data

Sep. 12, 2002 (JP) .................................... P. 2002-266901

(51) Int. Cl.[7] .............................................. G11C 7/00
(52) U.S. Cl. ...................... 365/191; 365/233; 365/210
(58) Field of Search ................................ 365/191, 233, 365/210, 189.01, 230.05

(56) References Cited

U.S. PATENT DOCUMENTS 5,384,734 A    1/1995  Tsujihashi et al.
5,477,502 A   12/1995  Hayashi
6,014,340 A  *  1/2000  Sawada ...................... 365/233

\* cited by examiner

*Primary Examiner*—David Lam
(74) *Attorney, Agent, or Firm*—McDermott Will & Emery LLP

(57) ABSTRACT

There are provided at least one read word line 15, 16 and 17 for transmitting a read control signal to a memory cell, at least one read bit line 18, 19 and 20 for transmitting information of the memory cell to an outside according to activation of the read control signal corresponding to the read word line, at least one write word line 11 and 12 for transmitting a write control signal to the memory cell, and at least one write bit line 13 and 14 for transmitting external information to the memory cell according to activation of the write control signal corresponding to the write word line, wherein the read bit line and the write bit line are provided as alternately as possible and the read control signal and the write control signal are controlled so as not to be activated at the same time.

25 Claims, 29 Drawing Sheets

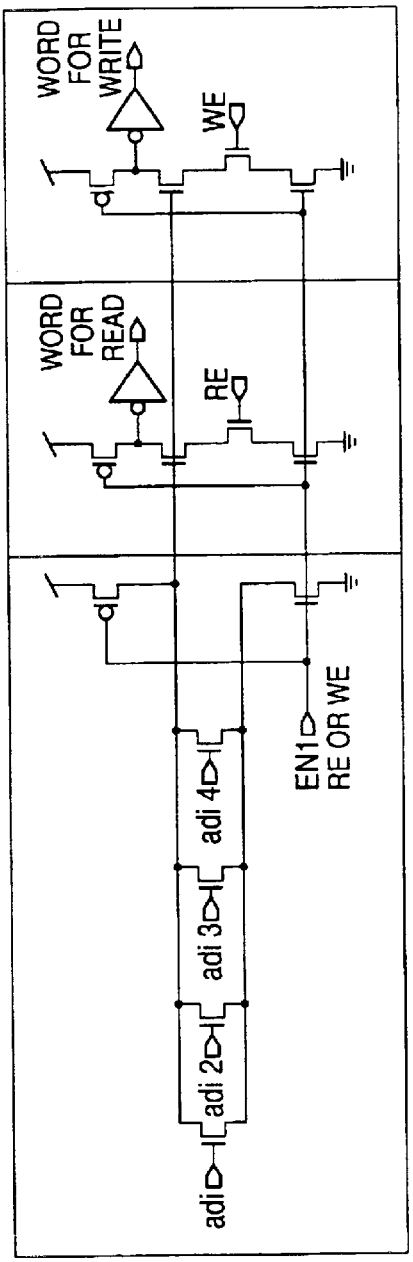
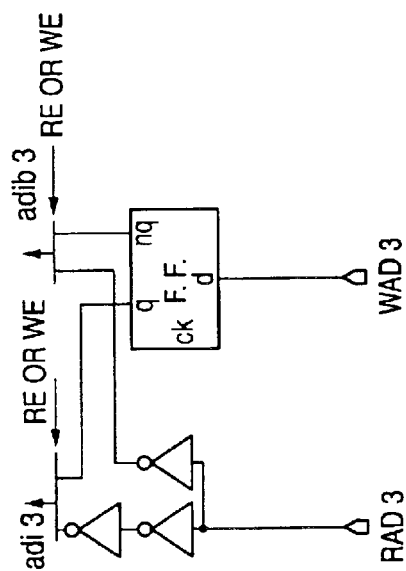
FIG. 12 (a)
FIG. 12 (b)

FIG. 28 *(PRIOR ART)*

MEMORY DEVICE

BACKGROUND OF THE INVENTION

1. Field of the Invention

The present invention relates to a memory device having multiple ports, and more particularly to a memory device capable of reducing a cross coupling noise between the signals of the multiple ports.

2. Description of the Related Art

For a memory device having multiple ports, there has conventionally been proposed a register file to be used in a CPU. In general, the register file comprises a write port and a read port. In particular, a register file having a plurality of read ports and a plurality of write ports is often used in order to cope with many uses.

FIG. 27 is a circuit diagram showing an example of the structure of a memory cell of a conventional register file having two write ports and three read ports. In FIG. 27, a memory cell is constituted by transfer gates 1 and 2 for inputting write data, a storage element including inverters 3 and 4 for storing data, and NMOS transistors 5 to 10 for reading data from the storage element.

For signal lines to control the write and read of the memory cell, furthermore, there are provided write word lines 11 and 12 for the two ports, write bit lines 13 and 14 for the respective ports, read word lines 15 to 17 for the three ports, and read bit lines 18 to 20 for the respective ports.

FIG. 28 is a block diagram showing an example of the structure of a register file including the memory cells, each having the structure as shown in FIG. 27. In FIG. 28, the register file comprises a memory cell array 200 having the memory cells arranged with a 32-entry and 32-bit structure, an address decoder 210 for generating the address of the memory cell, a read data holding circuit 220 for holding data read from the memory cell, a write data holding circuit 230 for holding data to be written to the memory cell, and a control circuit 240.

A 4-bit address for each of the two write ports and a 5-bit address for each of the three read ports are given from the outside to the register file. The address decoder 210 decodes the given addresses and is connected to the memory cell array 200 with 64 write word lines having 32 entries and 2 ports and 96 read word lines having 32 entries and 3 ports. The read data holding circuit 220 and the memory cell array 200 are connected to each other with 3-port read bit lines, each of which has 32 bits, and the write data holding circuit 230 and the memory cell array 200 are connected to each other with 2-port write bit lines, each of which has 32 bits.

FIG. 29 is a timing chart for explaining the operation of the register file illustrated in FIGS. 26 and 27. The register file is operated synchronously with a clock signal CLK, and carries out reading at the H level of the clock signal CLK and writing at the L level thereof.

In FIG. 29, when the clock signal CLK has the L level, a write word line specified by the write address of a selected port is set to have the H level. With a port number of 0 and a word number of 1, the transfer gate 1 is turned ON in FIG. 27. Consequently, the data of the write bit line 13 having the port number of 0 are stored in the storage element having the word number of 1 through the transfer gate 1.

When the clock signal CLK has the H level, a read word line specified by the read address of a selected port is set to have the H level. With the port number of 0 and the word number of 1, the transistor 5 is turned ON in FIG. 27. Consequently, data stored in the storage element having the word number of 1 are read onto the read bit line 18 having the port number of 0 through the transistor 6.

A semiconductor integrated circuit has continually progressed a semiconductor technology to meet a requirement for an increase in integration without an end and microfabrication has further made progress in a semiconductor processing. With the microfabrication of the semiconductor processing, a malfunction caused by a cross coupling noise between adjacent bit lines or word lines has further been serious.

With the microfabrication, moreover, it is necessary to reduce a drain leakage when dropping a source voltage to carry out a writing operation to a memory cell. When the drain leakage is reduced, the threshold of the transistor is increased. For this reason, there is a problem in that ideal scaling corresponding to the microfabrication cannot be always carried out and it is hard to drop the source voltage.

In order to carry out a microfabrication processing, moreover, an exposure wavelength is reduced in a manufacturing process. In order to realize the function and characteristic of the memory cell, it is desirable that the mask data of a transistor should be optimized according to a reduction in a wavelength or an optical phase correction should be individually carried out in exposure. However, an enormous man-hour is required for the optimization of the mask data, and furthermore, it is hard to carry out a partial optical phase correction because the exposure is performed for a whole wafer. Accordingly, there is a problem in that the memory cell is to be designed on the assumption that the mask data which can be compromised to some extent are used.

SUMMARY OF THE INVENTION

In consideration of the circumstances, it is an object of the invention to provide a memory device capable of reducing the cross coupling noises of a bit line and a word line which are made with the microfabrication processing of a semiconductor.

It is another object of the invention to provide a microfabricated memory device capable of dropping a source voltage. It is a further object to provide a memory device capable of sharing the physical shape of a transistor and preventing a deterioration in performance by using mask data which can be compromised to some extent.

In order to solve the problems, a first aspect of the invention is directed to a memory device comprising at least one read control signal line (read word line) for transmitting a read control signal to a memory cell, at least one read signal line (read bit line) for transmitting information of the memory cell to an outside according to activation of the read control signal corresponding to the read word line, at least one write control signal line (write word line) for transmitting a write control signal to the memory cell, and at least one write signal line (write bit line) for transmitting external information to the memory cell according to activation of the write control signal corresponding to the write word line, wherein the read bit line and the write bit line are alternately provided and the read control signal and the write control signal are controlled so as not to be activated at the same time.

According to the structure, the read word line and the write word line for a memory cell array are controlled so as not to be activated at the same time. Therefore, the read bit line and the write bit line are not operated at the same time and they are physically arranged alternately in the layout section of the memory cell. Consequently, either of the bit lines functions as a shield, an interference is not caused between the bit lines and the malfunction of the read bit line and that of the write bit line can be prevented.

A second aspect of the invention is directed to the memory device according to the first aspect of the invention, wherein the write control signal is activated after it is detected that the information of the memory cell is transmitted to the outside according to the activation of the read control signal.

According to the structure, it is detected that the information of the memory cell is read onto the read bit line and the write control signal is then started. Consequently, a reading and writing operation for the memory cell array can be carried out autonomously and it is possible to ensure such control as not to activate the read word line and the write word line at the same time.

A third aspect of the invention is directed to the memory device according to the first or second aspect of the invention, wherein the read control signal is deactivated after it is detected that the information of the memory cell is transmitted to the outside according to the activation of the read control signal.

According to the structure, it is detected that the information of the memory cell is read onto the read bit line and the read control signal is then deactivated. Consequently, it is possible to autonomously control a reading operation for the memory cell array and to shorten a read cycle.

A fourth aspect of the invention is directed to the memory device according to the second or third aspect of the invention, wherein a dummy memory cell is constituted by using a semiconductor element having the same shape as that of a semiconductor element forming the memory cell, and a circuit of the dummy memory cell is constituted to include a dummy read word line and a dummy read bit line having the same load characteristics as those of the read word line and the read bit line respectively, and the dummy memory cell serves to output a fixed storage value to the dummy read bit line when the dummy read word line is activated in response to a read control signal, and to detect that information of the memory cell according to the second or third aspect of the invention is transmitted to an outside by detection of the fixed storage value in the dummy read bit line.

According to the structure, the dummy memory cell is constituted by using a transistor having the same shape as that of the memory cell and the circuit is constituted in such a manner that the load characteristics of the signal lines for controlling the read are also caused to be identical to each other. Consequently, it is possible to cause the operating characteristic of each signal line in the dummy memory cell to be coincident with the operating characteristic of the memory cell without depending on a variation in a process, a fluctuation in a temperature or a change in a voltage. Thus, it is possible to reliably detect that the information of the memory cell according to the second or third aspect of the invention is transmitted to the outside.

A fifth aspect of the invention is directed to the memory device according to the fourth aspect of the invention, wherein a dummy memory cell is constituted by using a semiconductor element having the same shape as that of a semiconductor element forming the memory cell, and a circuit of the dummy memory cell is constituted to include a first dummy write word line having the same load characteristic as that of the write word line and serving to receive the read control signal, a second dummy write word line having the same load characteristic as that of the write word line and serving to receive the write control signal, a dummy write bit line having the same load characteristic as that of the write bit line and serving to receive a dummy write value, and a dummy write detection signal line having the same load characteristic as that of the read bit line, the dummy write value being written to the dummy memory cell corresponding to the activation of the read control signal, the dummy write value being inverted when it is detected that the written dummy write value is output to the dummy write detection signal line, and the inverted dummy write value being written to the dummy memory cell according to the activation of the write control signal.

According to the structure, the dummy memory cell is constituted by using a transistor having the same shape as that of the memory cell and the circuit is constituted in such a manner that the load characteristics of the signal lines for controlling the write are also caused to be identical to each other. Consequently, it is possible to cause the operating characteristic of each signal line in the dummy memory cell to be coincident with the operating characteristic of the memory cell without depending on a variation in a process, a fluctuation in a temperature or a change in a voltage. Thus, a serial operation for detecting a dummy write value in the dummy write detection signal line, inverting the dummy write value and carrying out rewrite to the dummy memory cell can reliably be performed in a read and write cycle so that the dummy memory cell can be initialized.

A sixth aspect of the invention is directed to the memory device according to the fifth aspect of the invention, wherein the write control signal is deactivated after it is detected that the dummy write value written to the dummy memory cell is output to the dummy write detection signal line.

According to the structure, it is detected that the dummy write value is output from the dummy memory cell to the dummy write detection signal line and the write control signal is then deactivated. Therefore, it is possible to autonomously control a writing operation for the memory cell array and to shorten a write cycle.

A seventh aspect of the invention is directed to the memory device according to the sixth aspect of the invention, wherein the dummy write value is given synchronously with a clock signal and the read control signal is then activated, thereby repeating a series of operations for writing the dummy write value to the dummy memory cell, reading a fixed storage value from the dummy memory cell, deactivating the read control signal, activating the write control signal, inverting the dummy write value by the detection of the output of the dummy write value written to the dummy memory cell, writing the inverted dummy write value to the dummy memory cell, and deactivating the write control signal.

According to the structure, the dummy write value is given and the read control signal is then activated synchronously with the clock signal so that the serial reading and writing operation is autonomously carried out. Consequently, it is possible to form the most efficient read and write cycle which is synchronous with the clock signal without depending on a variation in a process, a fluctuation in a temperature or a change in a voltage. Moreover, there is an advantage that it is not necessary to guarantee the duty of a clock because the serial operation does not depend on the duty ratio of the clock.

An eighth aspect of the invention is directed to the memory device according to the first aspect of the invention, wherein the read control signal is activated after it is detected that the external information is transmitted to the memory cell according to the activation of the write control signal.

According to the structure, it is detected that information about the write bit line is written to the memory cell and the read control signal is then started. Consequently, the writing and reading operation for the memory cell array can be controlled autonomously and it is possible to reliably carry out such control as not to activate the read word line and the write word line at the same time.

A ninth aspect of the invention is directed to the memory device according to the first or eighth aspect of the invention, wherein the write control signal is deactivated after it is detected that the external information is transmitted to the memory cell according to the activation of the write control signal.

According to the structure, it is detected that information about the write bit line is written to the memory cell and the write control signal is then deactivated. Consequently, it is possible to autonomously control a writing operation for the memory cell array and to shorten a write cycle.

A tenth aspect of the invention is directed to the memory device according to the eighth or ninth aspect of the invention, wherein a dummy memory cell is constituted by using a semiconductor element having the same shape as that of a semiconductor element forming the memory cell, and a circuit of the dummy memory cell is constituted to include a first dummy write word line having the same load characteristic as that of the write word line and serving to receive the read control signal, a second dummy write word line having the same load characteristic as that of the write word line and serving to receive the write control signal, a dummy write bit line having the same load characteristic as that of the write bit line and serving to receive a dummy write value, and a dummy write detection signal line having the same load characteristic as that of the read bit line, the dummy write value being written to the dummy memory cell according to the activation of the write control signal and the transmission of the external information according to the eighth or ninth aspect of the invention to the memory cell being detected depending on detection of the dummy write value written to the dummy memory cell which is output to the dummy write detection signal line.

According to the structure, the dummy memory cell is constituted by using a transistor having the same shape as that of the memory cell and the circuit is constituted in such a manner that the load characteristics of the signal lines for controlling the write are caused to be identical to each other. Consequently, it is possible to cause the operating characteristic of each signal line in the dummy memory cell to be coincident with the operating characteristic of the memory cell without depending on a variation in a process, a fluctuation in a temperature or a change in a voltage. Consequently, it is possible to reliably detect that the external information according to the eighth or ninth aspect of the invention is transmitted to the memory cell.

An eleventh aspect of the invention is directed to the memory device according to the tenth aspect of the invention, wherein the dummy write value is inverted by the detection of the output, to the dummy write detection signal line, of the dummy write value written to the dummy memory cell, and the inverted dummy write value is written to the dummy memory cell according to the activation of the read control signal.

According to the structure, the dummy write value is inverted by the detection of the dummy write value in the dummy write detection signal line, and rewriting to the dummy memory cell is carried out in a read cycle. Consequently, it is possible to reliably perform a serial operation according to a write and read cycle and to initialize the dummy memory cell.

A twelfth aspect of the invention is directed to the memory device according to the tenth or eleventh aspect of the invention, wherein a dummy memory cell is constituted by using a semiconductor element having the same shape as that of a semiconductor element forming the memory cell, and a circuit of the dummy memory cell is constituted to include a dummy read word line and a dummy read bit line having the same load characteristics as those of the read word line and the read bit line respectively, the dummy memory cell serving to output a fixed storage value to the dummy read bit line when activating the dummy read word line in response to the read control signal, and to deactivate the read control signal by detection of the fixed storage value in the dummy read bit line.

According to the structure, the dummy memory cell is constituted by using a transistor having the same shape as that of the memory cell and the circuit is constituted in such a manner that the load characteristics of the signal lines for controlling the read are caused to be identical to each other. Consequently, it is possible to cause the operating characteristic of each signal line in the dummy memory cell to be coincident with the operating characteristic of the memory cell without depending on a variation in a process, a fluctuation in a temperature or a change in a voltage. By deactivating the read control signal by the detection of the fixed storage value in the dummy read bit line, consequently, it is possible to autonomously control a reading operation for the memory cell array and to shorten a read cycle.

A thirteenth aspect of the invention is directed to the memory device according to the twelfth aspect of the invention, wherein the dummy write value is given synchronously with a clock signal and the write control signal is then activated, thereby repeating a series of operations for writing the dummy write value to the dummy memory cell, inverting the dummy write value by the detection of the written dummy write value in an output of the dummy memory cell, deactivating the write control signal, activating the read control signal, writing the inverted dummy write value to the dummy memory cell, reading the fixed storage value from the dummy memory cell, and deactivating the read control signal.

According to the structure, the dummy write value is given and the write control signal is then activated synchronously with the clock signal so that the serial writing and reading operation is autonomously carried out. Consequently, it is possible to form the most efficient write and read cycle which is synchronous with the clock signal without depending on a variation in a process, a fluctuation in a temperature or a change in a voltage. Moreover, there is an advantage that it is not necessary to guarantee the duty of a clock because the serial operation does not depend on the duty ratio of the clock.

A fourteenth aspect of the invention is directed to the memory device according to any of the first to thirteenth aspects of the invention, wherein the read word line and the write word line are provided as alternately as possible.

According to the structure, the read word line and the write word line for the memory cell array are controlled so as not to be activated at the same time in the memory device according to any of the first to thirteenth aspects of the invention. Consequently, the read word line and the write word line are physically arranged alternately. Thus, either of the word lines functions as a shield so that it is possible to produce an advantage that a cross coupling noise between the word lines can be prevented.

A fifteenth aspect of the invention is directed to the memory device according to any of the first to fourteenth aspects of the invention, wherein an absolute value of a substrate voltage of an MOSFET constituting a storage element in the memory cell is set to be greater than that of a signal voltage to be applied to the storage element at time of the activation of the read control signal.

According to the structure, the absolute value of the substrate voltage of the MOSFET constituting the storage element is set to be greater than that of the signal voltage to be applied to the storage element. Consequently, the absolute value of a threshold can be increased. Thus, it is possible to produce an advantage that a noise resistance is correspondingly increased and a writing malfunction is caused with difficulty when a voltage drop is generated in the write word line by the cross coupling effect with the fall of the read word line. In other words, a current between the source and the drain of the MOSFET can be reduced.

A sixteenth aspect of the invention is directed to the memory device according to any of the first to fourteenth aspects of the invention, wherein an absolute value of a substrate voltage of a transfer gate in the memory cell is set to be greater than that of a signal voltage to be applied to a storage element at time of the activation of the read control signal.

According to the structure, also in the case in which only the substrate voltage of the MOSFET is raised with difficulty for convenience of a layout, the substrate voltage of the transfer gate in the memory cell is raised so that it is possible to produce an advantage that a writing malfunction is caused with difficulty even if a glitch is generated (in the case in which a voltage drop is generated in the write word line if the write word line is "H" in the non-selection of the write word line).

A seventeenth aspect of the invention is directed to the memory device according to the sixteenth aspect of the invention, wherein a substrate voltage of a P-channel MOSFET of the transfer gate is raised.

According to the structure, the substrate voltage of the P-channel MOSFET of the transfer gate is raised. Consequently, it is possible to particularly minimize a reduction in the speed of a reading system.

An eighteenth aspect of the invention is directed to the memory device according to any of the first to seventeenth aspects of the invention, wherein a write control circuit for writing information to the memory cell is provided with an MOSFET which is constituted by a switch of the transfer gate having an inverting logic circuit to be controlled in response to the write control signal, and has a gate connected to an output of the inverting logic circuit, a drain connected to the write word line, and a source connected to a power supply or a ground.

According to the structure, by the MOSFET, a current path is generated in the write word line when the read word line falls. Consequently, the impedance of the write word line is reduced. Thus, it is possible to produce an advantage that the ratio of a coupling capacity to the read word line can be decreased and the influence of a cross coupling noise can be reduced.

A nineteenth aspect of the invention is directed to the memory device according to any of the first to eighteenth aspects of the invention, wherein a driving source of the write word line is provided with an MOSFET having a gate connected to an input of an inverting logic gate for driving the read word line, a source connected to an output of a normal logic gate for inputting the write control signal, and a drain connected to the write word line.

According to the structure, the impedance of the write word line becomes higher by the MOSFET than that in case of connection to a power supply, and the transient response speed of a drop in a source voltage caused by a coupling generated due to the fall of the read word line is reduced. Consequently, the voltage value of the write word line can be maintained to be great and the drop in the source voltage can be absorbed.

A twentieth aspect of the invention is directed to the memory device according to any of the first to nineteenth aspects of the invention, wherein an MOSFET having a gate connected to an output of an inverting logic gate for inputting the read control signal, a source connected to an output of a normal logic gate for inputting the write control signal and a drain connected to the write word line is provided in a middle section or an end of the write word line.

According to the structure, even if the read word line falls, the voltage of the write word line can be maintained to be the source voltage for a time corresponding to the delay of the normal logic gate. Consequently, a cross coupling noise is made with difficulty on the write word line by the read word line so that erroneous writing can be prevented.

A twenty-first aspect of the invention is directed to a memory device, wherein a storage element in a memory cell is constituted by first and second inverting logic gates, a reset signal line is connected to a first source of the first inverting logic gate, a reset signal to be sent to the reset signal line is fixed to be inactive during a reading and writing operation of the memory cell, and the reset signal is activated to set a state of the storage element to have a desirable value for a period other than the reading and writing operation.

A twenty-second aspect of the invention is directed to the memory device according to the twenty-first aspect of the invention, wherein when a first source and a second source of the second inverting logic gate are to correspond to the first source and a second source of the first inverting logic gate, an inverting reset signal line for sending an inverted reset signal is connected to the second source of the second inverting logic gate.

A twenty-third aspect of the invention is directed to the memory device according to the twenty-first or twenty-second aspect of the invention, wherein the reset signal is activated in response to a signal indicative of completion of write to the memory cell.

According to the structure, there is employed a circuit structure in which the reset signal is sent to the storage element in the memory cell. Consequently, it is possible to initialize the storage element in the memory cell within one cycle also in the case in which the write word line is inactive. By employing such a structure, the physical shape of the transistor can be shared by another memory cell and a deterioration in performance can be prevented even if mask data which can be compromised to some extent are used.

A twenty-fourth aspect of the invention is directed to a memory device, wherein a storage element in a memory cell is constituted by first and second inverting logic gates, a NOT signal of AND of a write control signal and a write signal is connected to a first source of a transistor constituting the first inverting logic gate, an AND signal of a write control signal and an inverted write signal is connected to a second source of the transistor constituting the first inverting logic gate, a NOT signal of AND of the write control signal and the inverted write signal is connected to a first source of a transistor constituting the second inverting logic gate, and an AND signal of the write control signal and the write signal is connected to a second source of the transistor constituting the second inverting logic gate.

According to the structure, referring to the two inverting logic gates constituting the storage element in the memory cell, the sources of the transistors constituting the respective inverting logic gates are controlled by a write signal and an inverted signal thereof in response to the write control signal. Consequently, the intensity of the feedback of a feedback inverter in the memory cell can be released. Therefore, writing can easily be carried out even if the source voltage is dropped. Thus, the voltage of the memory device can be reduced.

A twenty-fifth aspect of the invention is directed to the memory device according to the twenty-fourth aspect of the invention, wherein there is provided a combination of the write control signals and the write signals, the storage element in the memory cell is constituted by using a combination of two inverting logic gates of which number is equal to the number of the write control signals and which are caused to correspond to the write control signals, gates and drains of the transistors constituting the respective inverting logic gates have corresponding points connected in parallel with each other, and the sources of the transistors constituting the respective inverting logic gates are connected to signals generated by the write control signal and the write signal which correspond to the respective inverting logic gates.

According to the structure, plural sets of inverting logic gates are properly connected in parallel with each other so that a storage element circuit having the same advantages as those of the memory device according to the twenty-second aspect of the invention can be constituted. Also in a memory device having multiple ports, therefore, the voltage of the memory device can be reduced.

BRIEF DESCRIPTION OF THE DRAWINGS

FIGS. 12(a) and 12(b) show the circuit diagrams showing the structure of the row decoder in the register file of the memory device according to the second embodiment of the invention.

DESCRIPTION OF THE PREFERRED EMBODIMENTS

Embodiments of the invention will be described below with reference to the drawings.

First Embodiment

Figure 1:
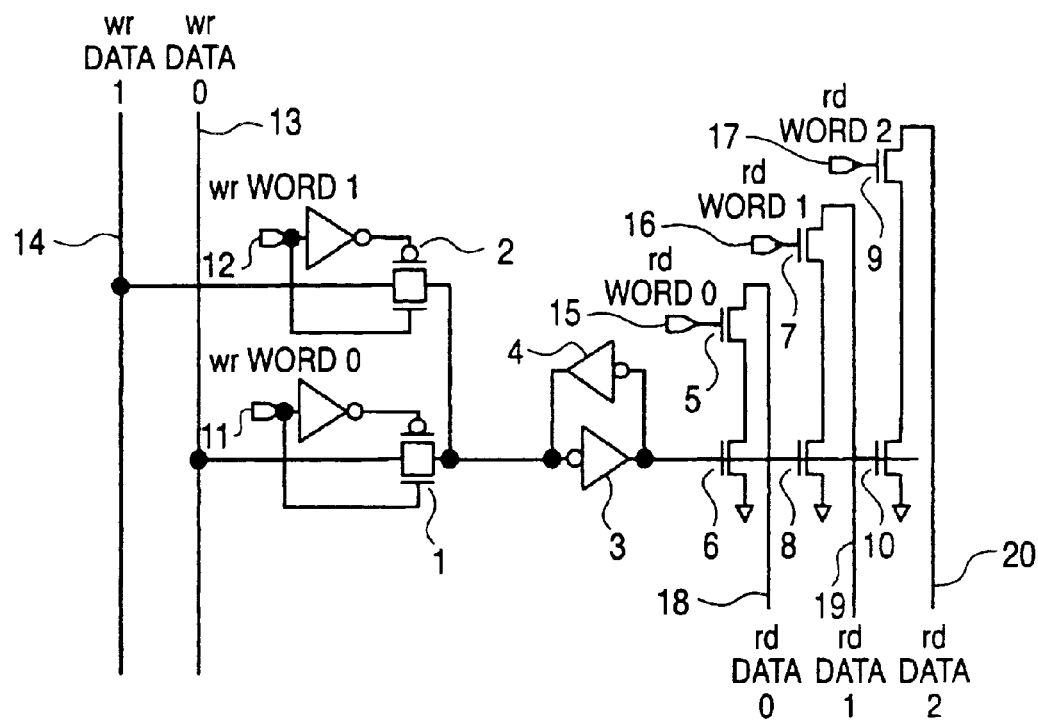
FIGS. 1(a) to 1(d) show the diagrams showing an example of the structures of a memory device according to a first embodiment of the invention.
Figure 1:
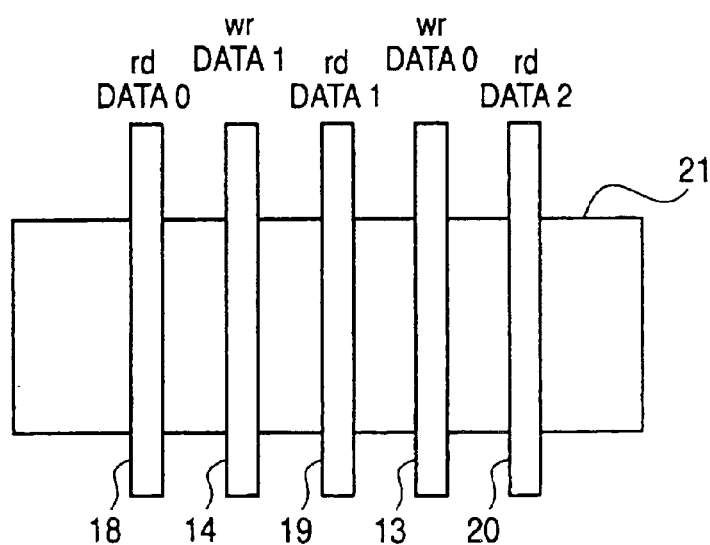
Figure 1:
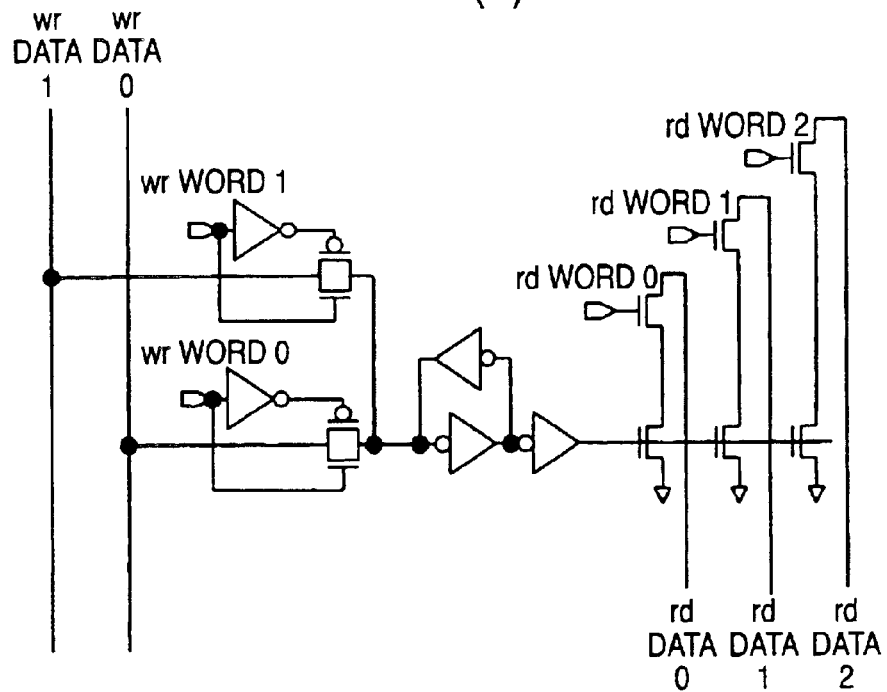
Figure 1:
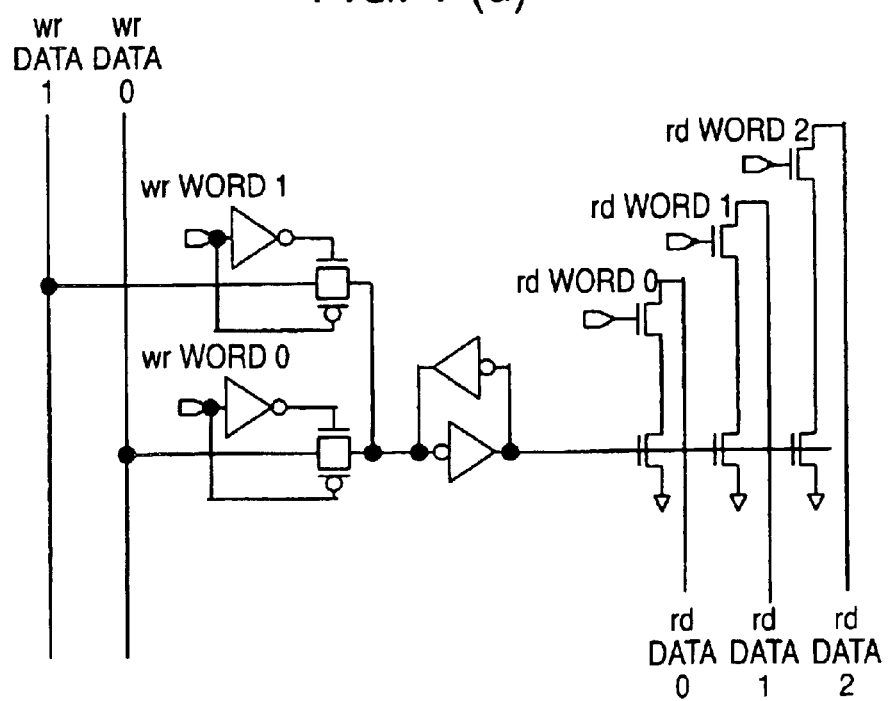

FIG. 1 is a diagram showing an example of the structure of a memory device according to a first embodiment of the invention. FIG. 1(a) is a circuit diagram showing an example of the structure of the memory cell of a register file having two write ports and three read ports as the memory device according to the embodiment, and FIG. 1(b) is a diagram showing the physical arrangement of a write bit line and a read bit line in the memory cell of FIG. 1(a).

Figure 20:
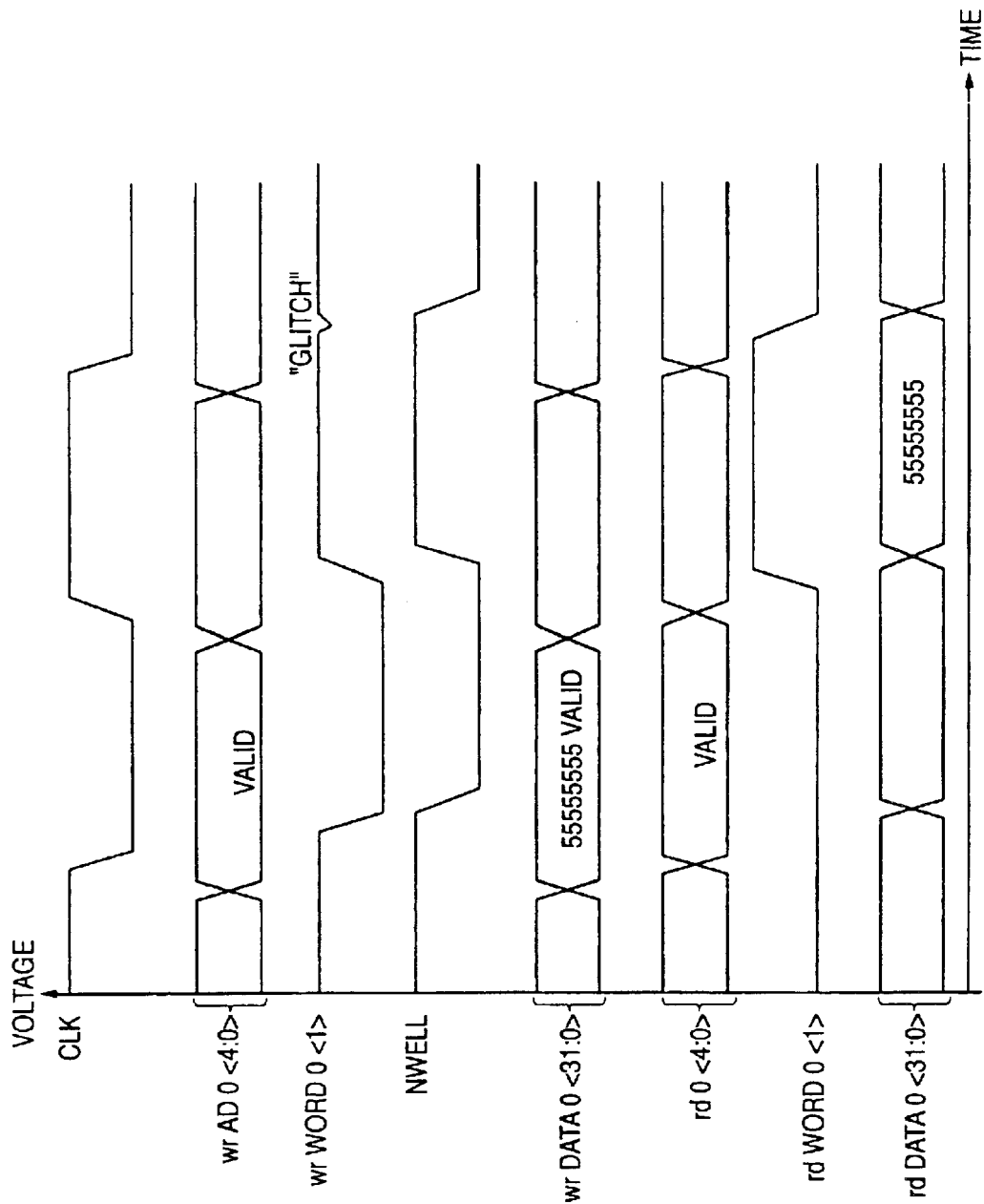
FIG. 20 is a timing chart for explaining the operation of a register file using the memory device for controlling the substrate voltage of the MOSFET according to the embodiment of the invention.

In FIG. 1(a), the same components as those in the example of the structure of a conventional memory device shown in FIG. 20 have the same reference numerals. More specifically, a memory cell is constituted by transfer gates 1 and 2 for inputting write data, a storage element including inverters 3 and 4 for storing data, and NMOS transistors 5 to 10 for reading data from the storage element. Furthermore, it is also possible to employ structures shown in FIGS. 1(c) and 1(d).

For signal lines to control the write and read of the memory cell, furthermore, there are provided write word lines 11 and 12 for the two ports, write bit lines 13 and 14 for the respective ports, read word lines 15 to 17 for the three ports, and read bit lines 18 to 20 for the respective ports.

The write bit lines and the read bit lines in these signal lines are physically arranged alternately in a layout section 21 of the memory cell as shown in FIG. 1(b). More specifically, the bit line 13 having a write port 0 is provided between the bit line 18 having a read port 0 and the bit line 19 having a read port 1, and the bit line 14 having a write port 1 is provided between the bit line 19 having the read port 1 and the bit line 20 having a read port 2.

In the memory device according to the embodiment, thus, if the number of the write ports is equal to that of the read ports, the write bit lines and the read bit lines can be arranged alternately in all bit positions. In the case in which the number of the write ports is different from that of the read ports, however, the write ports and the read ports are arranged alternately as much as possible. For example, in case of a memory cell having one write port and three read ports, two read bit lines are inevitably provided adjacently to each other. In the case in which different read ports are used for the odd and even cycles of a clock with a two-column structure, moreover, the read ports may be adjacent to each other.

Figure 2:
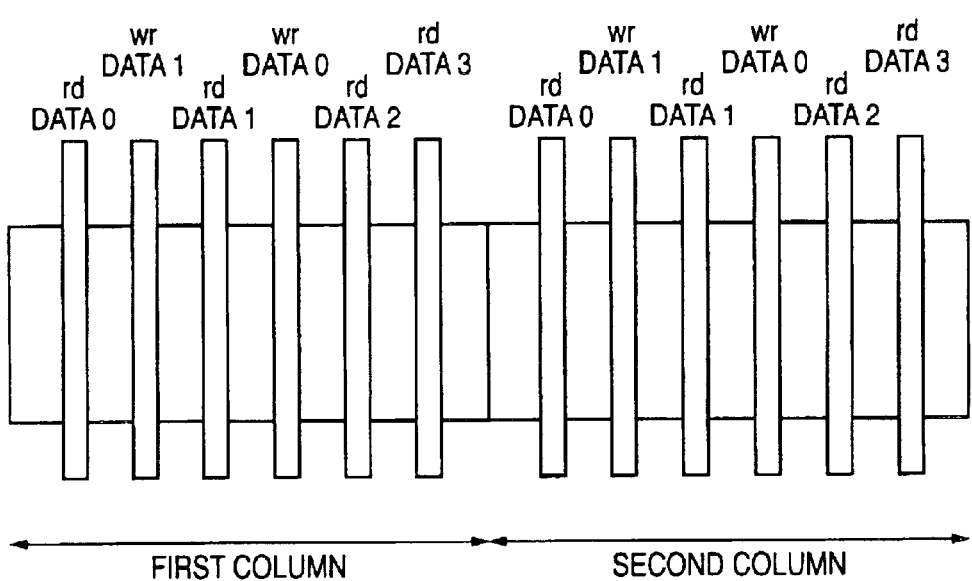
FIG. 2 is a diagram showing the layout of a 2-column structure in the memory device according to the first embodiment of the invention.

FIG. 2 shows an example of the layout of each port on the condition that four read ports and two write ports are provided and read bits rd data 0 to 2 and a read bit rd data 3 are read in different cycles.

Figure 3:
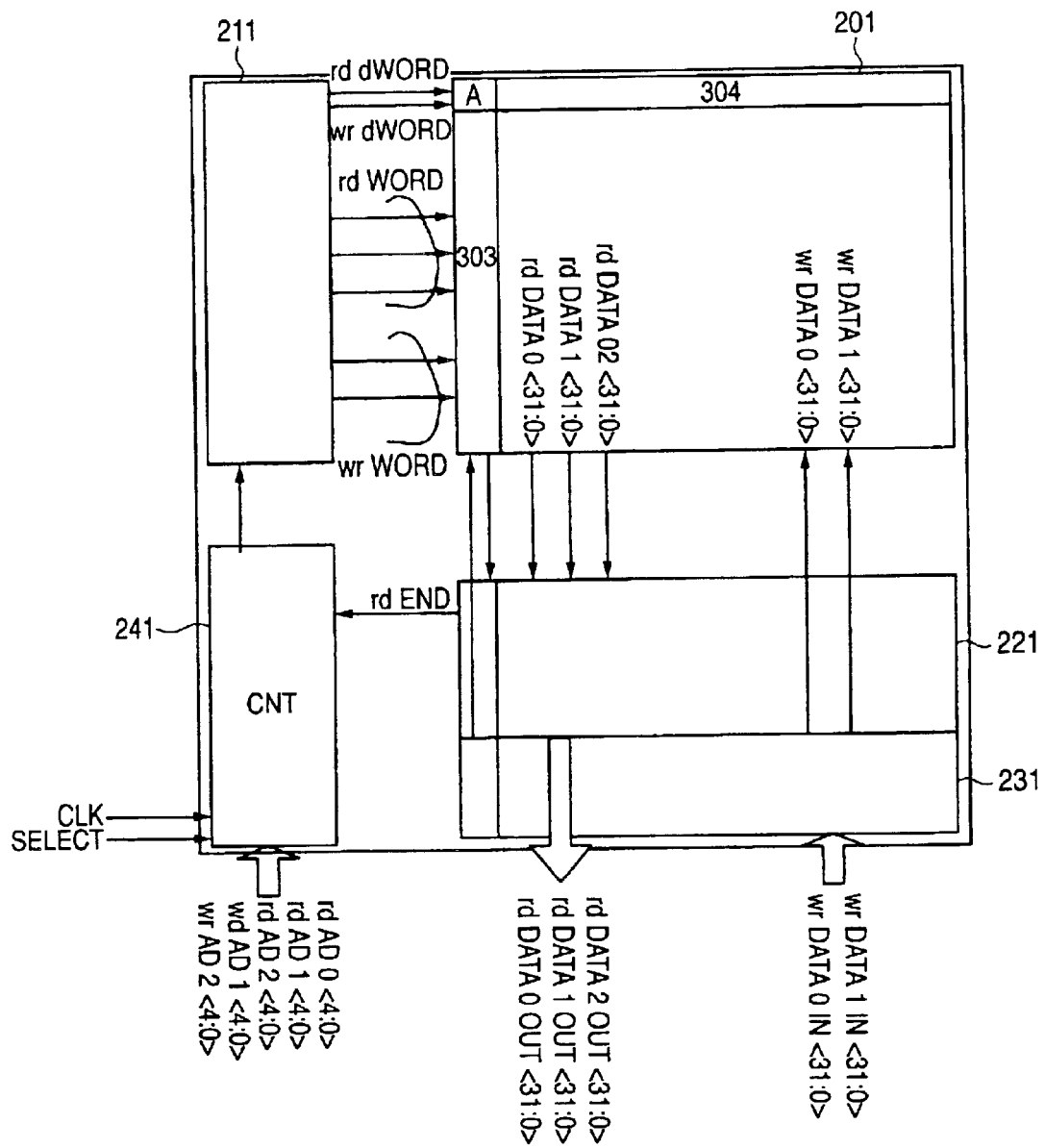
FIG. 3 is a block diagram showing an example of the structure of a register file in the memory device according to the first embodiment of the invention.

FIG. 3 is a block diagram showing an example of the structure of a register file including the memory cells, each having the structure as shown in FIG. 1. In FIG. 3, the register file comprises a memory cell array 201 in which the memory cells are arranged with a 33-entry and 33-bit structure, an address decoder 211 for generating the address of the memory cell, a read data holding circuit 221 for holding data read from the memory cell, a write data holding circuit 231 for holding data to be written to the memory cell, and a control circuit 241.

Figure 28:
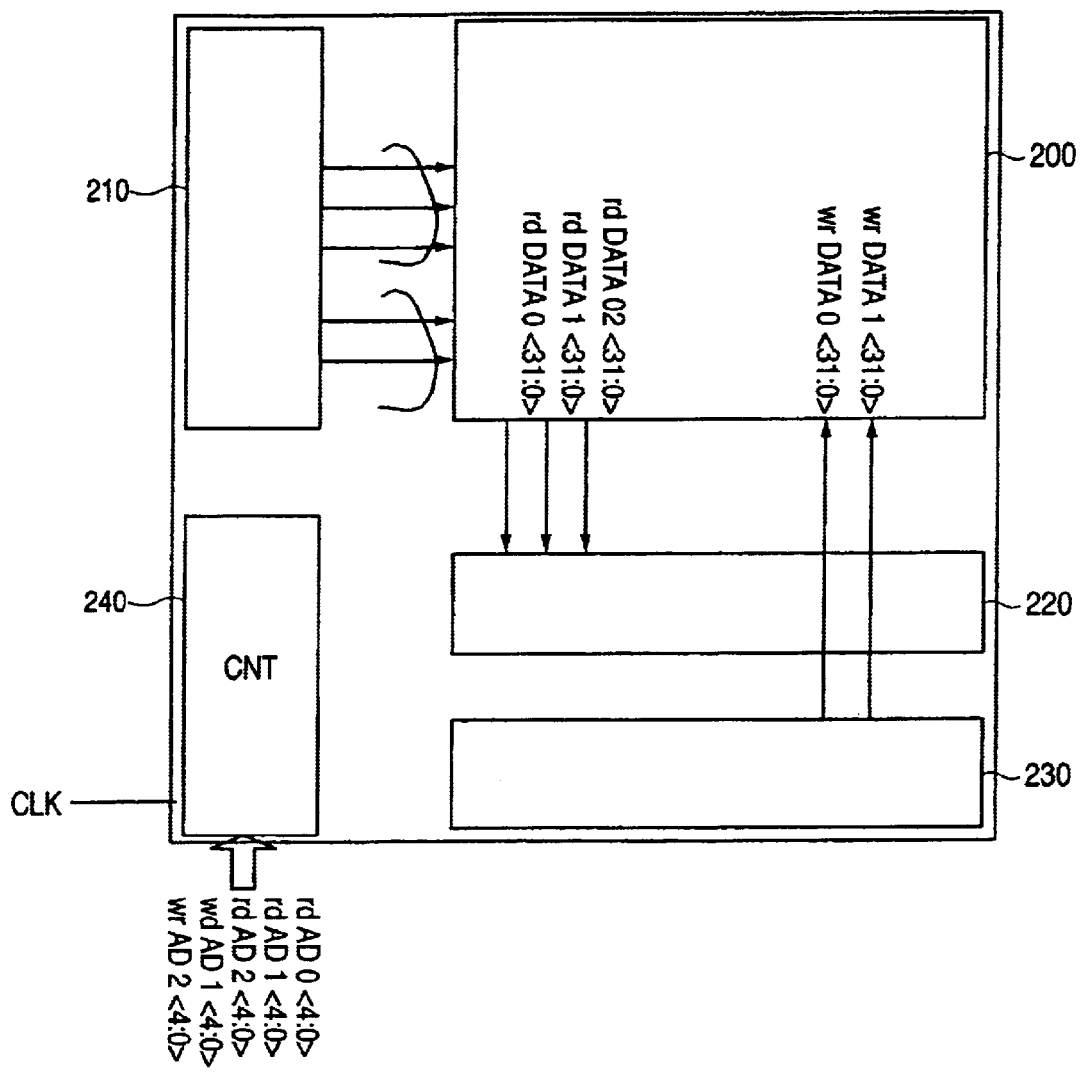
FIG. 28 is a block diagram showing an example of the structure of a register file using the conventional memory cell.
Figure 29:
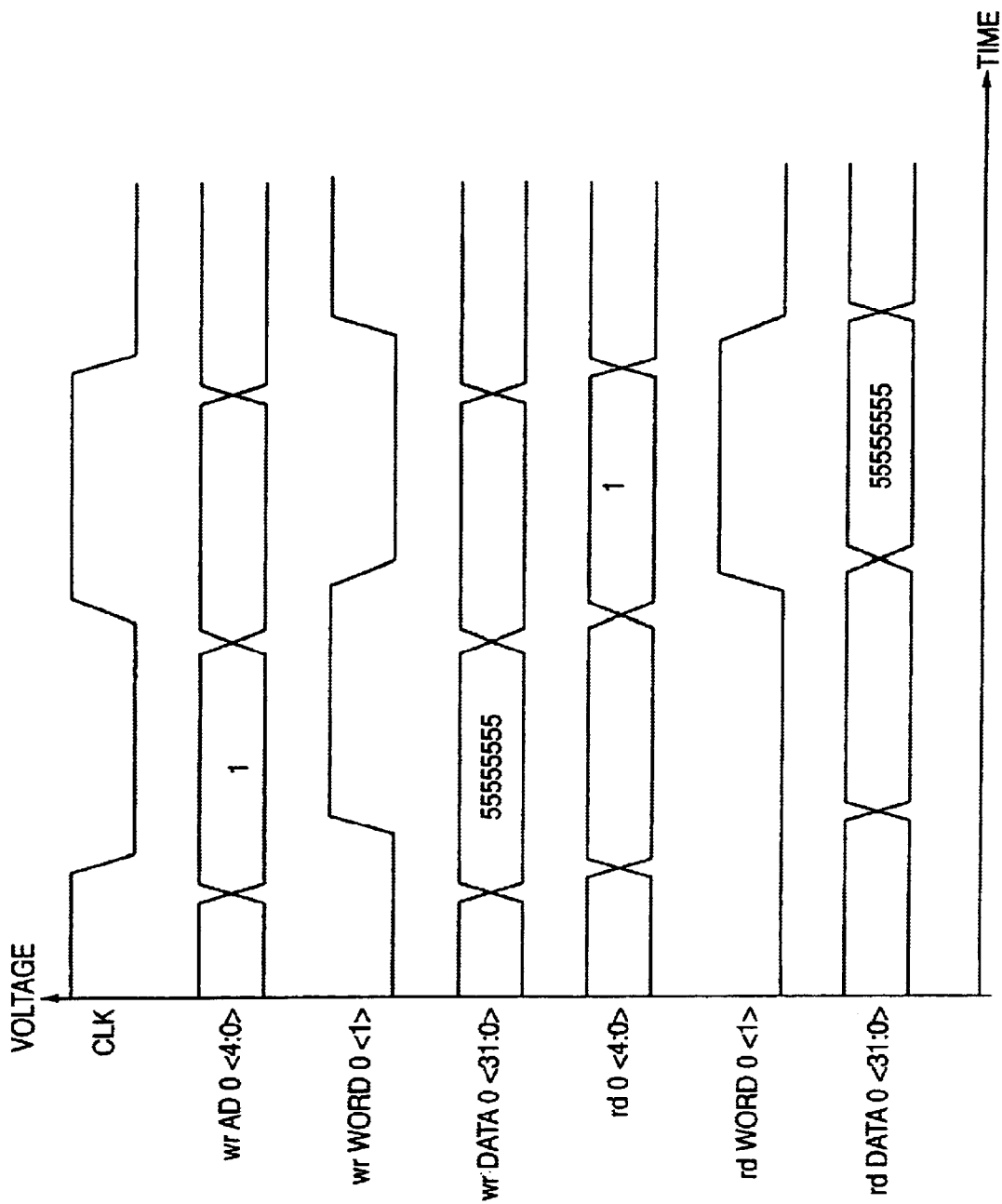
FIG. 29 is a timing chart for explaining the operation of the register file using the conventional memory cell.

The memory cell array 201 has such a structure that one dummy entry and one dummy bit are added to an ordinary memory cell array having a 32-entry and 32-bit structure. For this reason, a dummy memory cell A having a 1-dummy entry and 1-dummy bit structure, a dummy memory cell B having a 1-dummy entry and 32-bit structure, and a dummy memory cell C having a 32-entry and 1-dummy bit structure are added to the memory cell array 201 differently from the memory cell array 200 in FIG. 28.

In a reading operation, the dummy memory cell A outputs a fixed storage value to a dummy read bit line irrespective of a writing operation. Moreover, a dummy write detection signal line for outputting a written value to the outside is provided for detecting that a dummy write value is written in the writing operation.

In the dummy memory cell B and the dummy memory cell C, furthermore, a circuit is constituted and added in such a manner that the load characteristic of each signal line of the dummy memory cell A is identical to that of each signal line of a memory cell section having a 32-entry and 32-bit structure for storing original data when the dummy memory cell A is added. The dummy memory cell B causes the capacities of the read word line and the write word line to be equivalent to those of an ordinary memory cell, and the dummy memory cell C causes the capacities of the read bit line and the write bit line to be equivalent to those of the ordinary memory cell.

Figure 4:
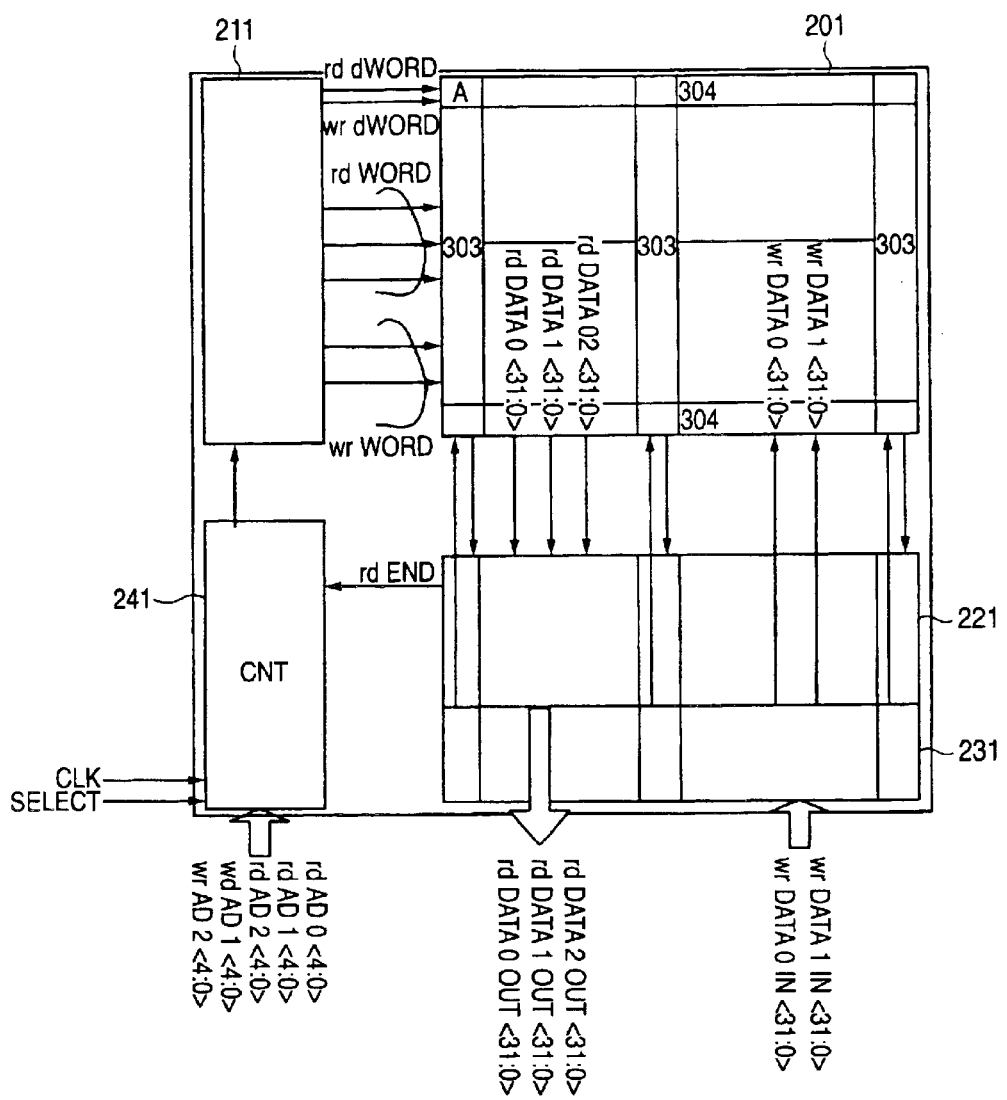
FIG. 4 is a block diagram showing an example of the modified structure of a register file in the memory device according to the first embodiment of the invention.

Furthermore, as an alternative structure of a register file including the memory cells, it is also preferable to have the dummy memory cells' layout as shown FIG. 4. In this layout, a center dummy cells and a right side dummy cells are provided in addition to the left side dummy cells in FIG. 3 so as to be symmetrically disposed from a centerline of the memory cell array. Striking a balance of the dummy memory cells in such a manner can stabilize the operation more firmly. These memory cells are constituted by using a transistor having the same shape as that of the memory cell shown in FIG. 1 so that the load characteristic of each signal line can be set to be identical to that of a memory cell array 301 and the load characteristic including a variation in a process, a fluctuation in a temperature or a change in a voltage can be approximated as compared with the case in which a delay characteristic is approximated by substituting an inverter.

Respective 5-bit addresses of the two write ports, respective 5-bit addresses of the three read ports, a clock signal CLK, and a select signal for selecting the register file are given from the outside to the register file, and an interface with the outside is carried out in response to respective 32-bit data input/output signals of the two write ports and the three read ports.

The address decoder 211 decodes the given addresses, and is connected to the memory cell array 201 with the read word line and write word line for the dummy memory cell A added to 64 32-entry and 2-port write word lines and 96 32-entry and 3-port read word lines. The read data holding circuit 221 and the write data holding circuit 231 are connected to the memory cell array 201 with the dummy read bit line, the dummy write bit line and the dummy write detection signal line added to 32-bit read bit lines of three ports and 32-bit write bit lines of two ports.

Figure 5:
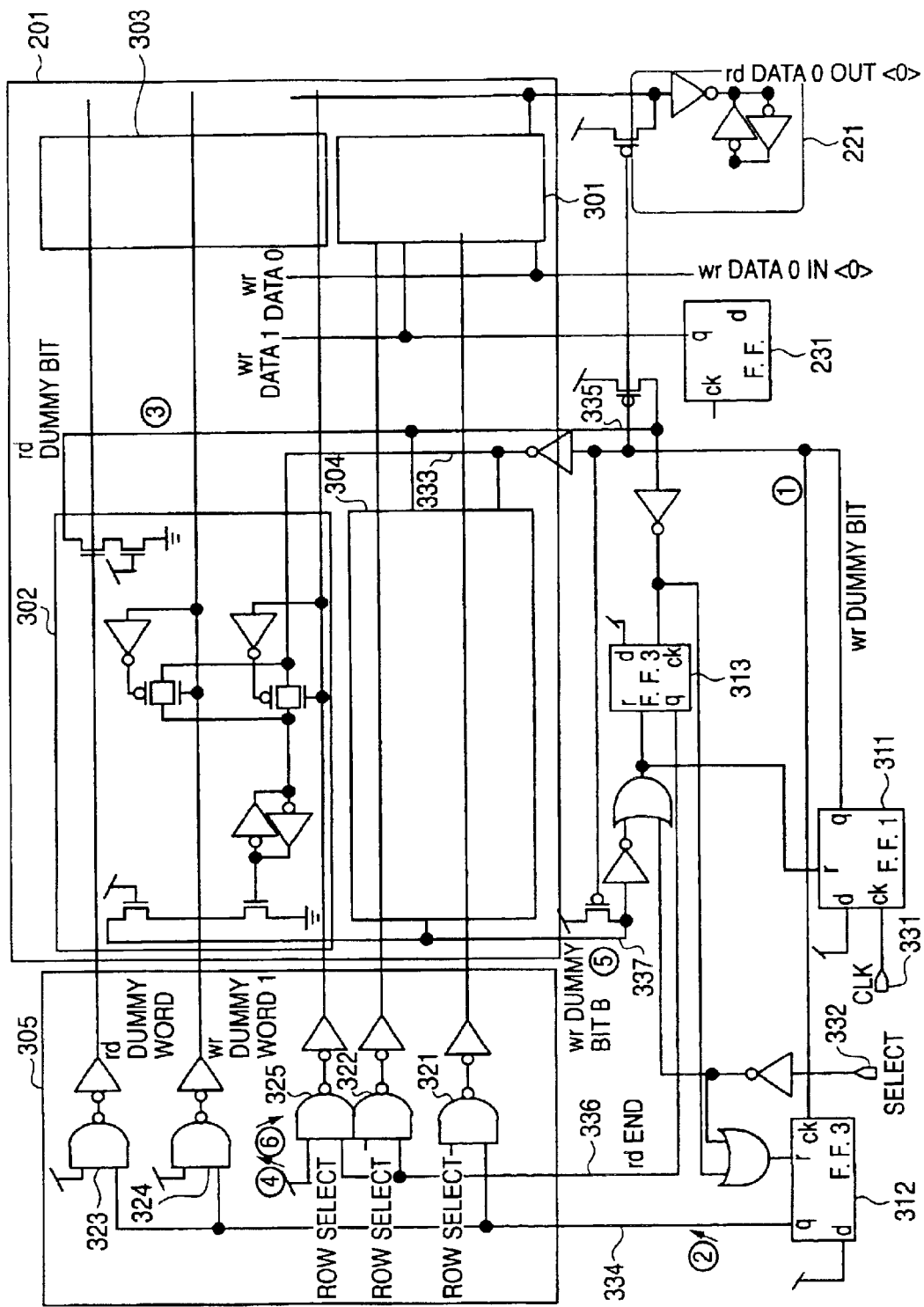
FIG. 5 is a circuit diagram showing an example of a detailed circuit structure for controlling the register file in the memory device according to the first embodiment of the invention.
Figure 6:
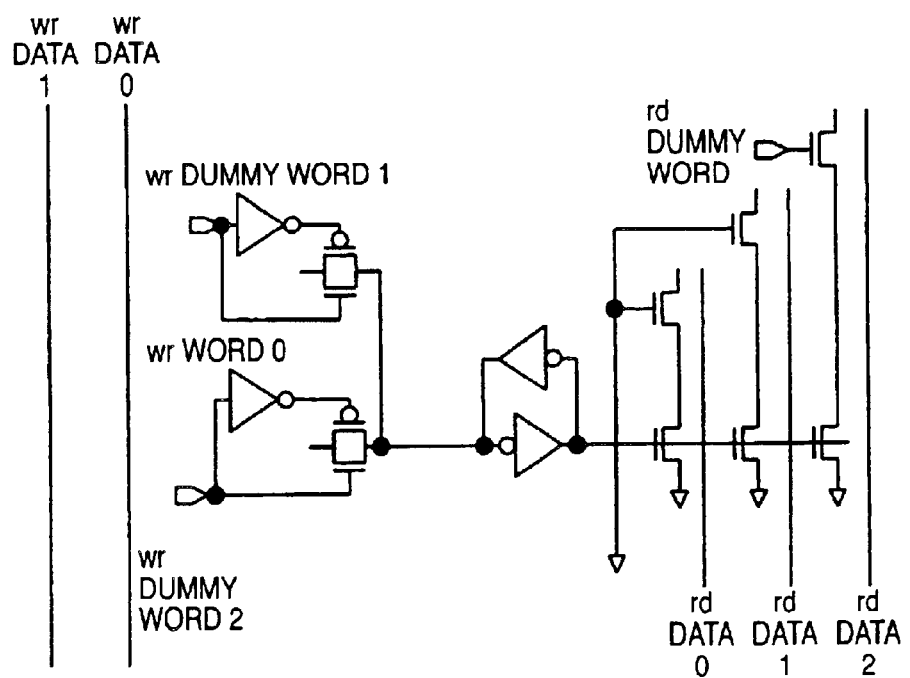
FIG. 6 is a circuit diagram showing an example of the circuit structure of a dummy memory cell B.
Figure 7:
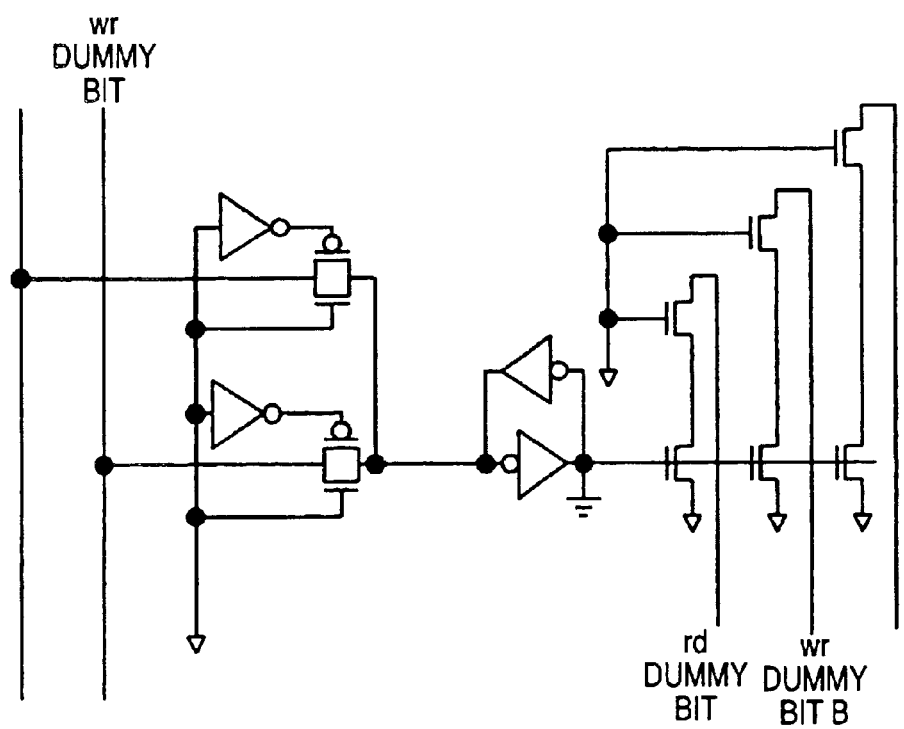
FIG. 7 is a circuit diagram showing an example of the circuit structure of a dummy memory cell C.

In the memory device having the structure described above, according to the invention, the read word line and the write word line are controlled so as not to be activated at the same time. FIG. 5 is a circuit diagram showing an example of a detailed circuit structure for controlling the write and read of the register file having the structure described above. FIG. 5 also shows an example of the circuit structure of the dummy memory cell A. Moreover, FIG. 6 shows an example of the circuit structure of the dummy memory cell B and FIG. 7 shows an example of the circuit structure of the dummy memory cell C.

In FIG. 5, the memory cell array 201 is constituted by a memory cell array 301 having a 32-entry and 32-bit structure, a dummy memory cell A302 having a 1-dummy entry and 1-dummy bit structure, a dummy memory cell B303 having a 1-dummy entry and 32-bit structure, and a dummy memory cell C304 having a 32-entry and 1-dummy bit structure as described above. Moreover, 305 denotes a word line control block for controlling the activation of a write word line and a read word line.

In FIG. 5, moreover, 311, 312 and 313 denote a flip-flop, 321 denotes a read row decoder for activating the read word line of the memory cell array 301, 322 denotes a write row decoder for activating the write word line of the memory cell array 301, 323 denotes a read dummy row decoder for activating the read word line of the dummy memory cell A, 324 denotes a first write dummy row decoder for activating the first dummy write word line of the dummy memory cell A, and 325 denotes a second write dummy row decoder for activating the second dummy write word line of the dummy memory cell A.

In FIG. 5, furthermore, 331 denotes a clock signal, 332 denotes a select signal, 333 denotes a dummy write bit line for giving a dummy write value to the dummy memory cell A, 334 denotes an output of the flip-flop 312 for giving a read control signal, 335 denotes a dummy read bit line through which a fixed storage value is read from the dummy memory cell A, 336 denotes an output of the flip-flop 313 for giving a write control signal, and 337 denotes a dummy write detection signal line for reading a dummy write value written to the dummy memory cell A.

Figure 8:
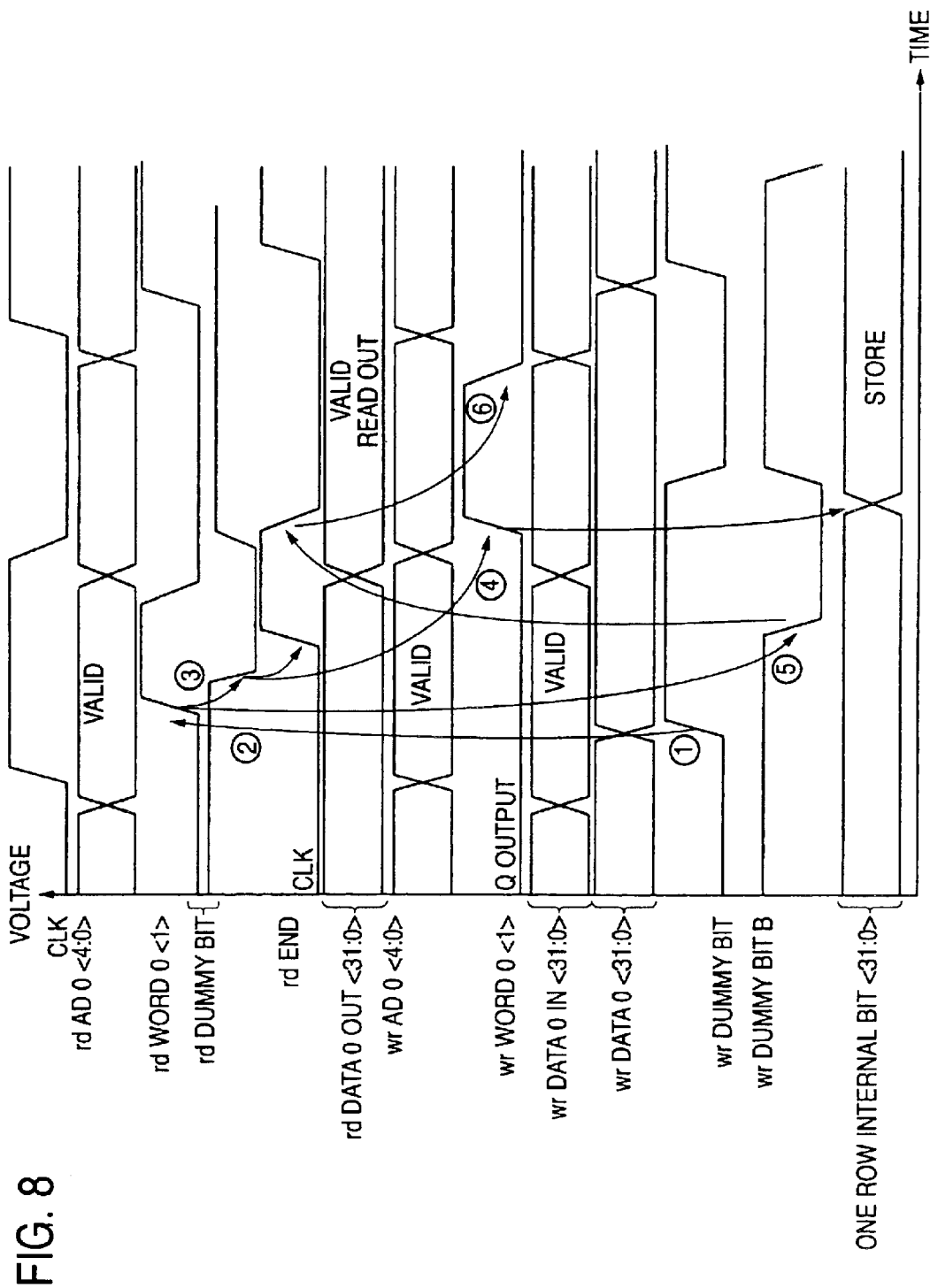
FIG. 8 is a timing chart for explaining the operation of the register file in the memory device according to the first embodiment of the invention.

Furthermore, FIG. 8 is a timing chart for explaining the operation of the control circuit shown in FIG. 5. With reference to FIGS. 4 to 7, description will be given to the operation of the register file comprising a memory cell having multiple ports by the memory device according to the embodiment. In FIGS. 7 and 4, the correspondence relationship between a signal timing and an operating circuit is represented by a numeral in a mark of ○. In the following description, moreover, (○ numeral) will be given.

In an initial state, first of all, when a select signal is changed from an L level to an H level, the flop-flops 311, 312 and 313 are set in a reset state and a Q output has the L level. Next, when a clock signal CLK is input, the flip-flop 311 is changed from the L level to the H level (○1). Consequently, the flip-flop 312 is changed from the L level to the H level (○2) so that a read row decoder 321, a read dummy decoder 323 and a first write dummy row decoder 324 are started.

Correspondingly, a dummy write value given from the output of the flip-flop 311 provided on a dummy write bit line 333 is written to the dummy memory cell A and the fixed storage value is output from the dummy memory cell A to a dummy read bit line 335 (○3). The flip-flop 312 is reset by the fixed storage value and the Q output is changed to have the L level so that the read row decoder 321 and the read dummy decoder 323 are deactivated (○3). Thus, the read cycle is ended.

Next, the clock input of the flip-flop 313 is changed to have the H level by the fixed storage value read onto the dummy read bit line 335. Consequently, the Q output of the flip-flop 313 is changed to have the H level so that the write row decoder 322 and the second write dummy row decoder 325 are started (○4).

Moreover, the flip-flop 311 is reset by the dummy write value read onto a dummy write detection signal line 337 (○5) and the dummy write bit line is inverted to have the L level. Consequently, the inverted dummy write value is written to the dummy memory cell A. At the same time, the flip-flop 313 is reset so that the write row decoder 322 and the second write dummy row decoder 325 are deactivated (○6) and the write cycle is thus ended. When 0 or 1 is to be written, it is important that a dummy structure in which a write duration is delayed is set to be the activation duration of the write word line.

The operation of one cycle for read and write is completed as described above. Thus, the read cycle and the write cycle are generated by using the flip-flops 311, 312 and 313 having reset. As compared with the case in which the inverted edge of a clock signal is used, therefore, there is an advantage that the duty of the clock does not need to be guaranteed because of no dependence on the duty ratio of the clock. Furthermore, neither the reading operation nor the writing operation depends on the duty ratio. Consequently, there is an advantage that a change in a speed can be prevented from being caused by a clock system (a change in the duty ratio which is caused by a jitter or a fluctuation in a process).

The activation duration of the word line serves to guarantee minimum times for reading and writing from the memory cell. Therefore, if there is a cell having a smaller current capability than that of the dummy memory cell, the same cell is excluded in an initial test. Thus, the structure according to the embodiment is very excellent in respect of the guarantee of quality for aging. In the case in which the dummy memory cell itself is defective, moreover, the same cell is not operated at a defined frequency so that it is excluded in the initial test.

As described above, the read word line and the write word line for the memory cell array 310 are controlled so as not to be activated at the same time. Consequently, the read bit line and the write bit line are not operated at the same time and are physically arranged alternately in the layout section of the memory cell. For this reason, either of the word lines functions as a shield. Consequently, there is an advantage that an interference is not generated between the bit lines and the malfunction of the read bit line and that of the write bit line can be prevented. In the embodiment, two write row decoders of the dummy memory cell are prepared and are started by the activation of the read row decoder and that of the write row decoder, respectively. If information to be stored in the dummy memory cell A is initialized within one cycle, one write row decoder of the dummy memory cell may be provided. While there has been described the case in which one port of the dummy cell is used for detection, moreover, a plurality of dummy cells may be utilized or the detection may be carried out based on information of multiple ports. In that case, precision can further be enhanced.

Figure 16:
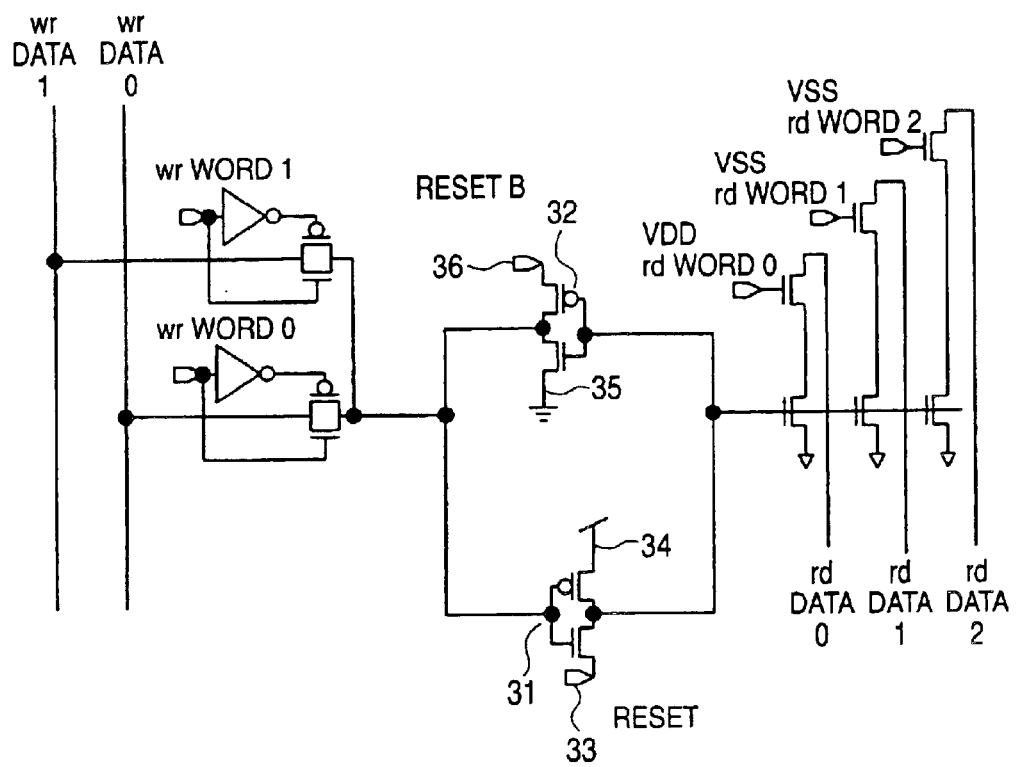
FIG. 16 is a circuit diagram showing an example of a circuit structure for initializing the inside of a dummy memory cell.

FIG. 16 is a circuit diagram showing an example of a circuit structure for initializing the inside of the dummy memory cell. In FIGS. 16, 31 and 32 denote first and second inverters constituting a storage element in the dummy memory cell respectively, 33 denotes a first source of the first inverter to be a reset terminal, 34 denotes a second source of the first inverter to be connected to a power supply, 35 denotes a first source of the second inverter to be grounded, and 36 denotes a second source of the second inverter to be an inverting reset terminal.

The Q output of the flip-flop 311 is connected to the reset terminal 33 and inversion information about the Q output of the flip-flop 311 is input to the inverting reset terminal 36. Also in the case in which the write word line is inactive, consequently, the initialization is carried out within one cycle. By employing such a structure, moreover, it is possible to reset the dummy memory cell without requiring the insertion of a special transistor and a change in the physical shape of a transistor constituting the circuit. Thus, the physical shapes of another memory cell and the transistor can be shared so that a deterioration in performance can be prevented.

Moreover, it is necessary to drop a source voltage with a microfabrication processing. Also in that case, the writing operation for the memory cell is to be guaranteed. FIGS. 17(a) and 17(b) shows the circuit diagrams showing the basic structure of a memory cell in which a writing operation can be carried out at a low voltage according to the invention. In FIG. 17(a), 37 and 38 denote first and second inverters constituting a storage element in the memory cell respectively, and in FIG. 17(b), 39 to 42 denote logic circuits for inputting write word lines and write bit lines and generating signals to be sent to the sources of transistors constituting the first and second inverters.

More specifically, in the case in which the signal of the write word line is represented by WE and the signal of the write bit line is represented by WD, a NOT signal of AND of WE and WD is sent to a first source IN1 of the transistor constituting the first inverter by the logic circuit 39, an AND signal of WE and inverted WD is sent to a second source IN2 of the transistor constituting the first inverter by the logic circuit 40, a NOT signal of AND of WE and inverted WD is sent to a first source IN3 of the transistor constituting the second inverter by the logic circuit 41, and an AND signal of WE and WD is sent to a second source IN4 of the transistor constituting the second inverter by the logic circuit 42. Thus, the intensity of the feedback of a feedback inverter in the memory cell can be released. Consequently, writing can easily be carried out even if a source voltage is lowered.

Further, as for the signal levels of Sn1, Sn2, Sn3 and Sn4 such as shown in the table of 16(a), where VDD is the source voltage and VSS is the ground voltage, their signal levels are fluctuated +/−0.4 V based from either VDD or VSS. Having the substrate voltages to be varied in this way, lower writing voltage can be more readily achieved.

Figure 18:
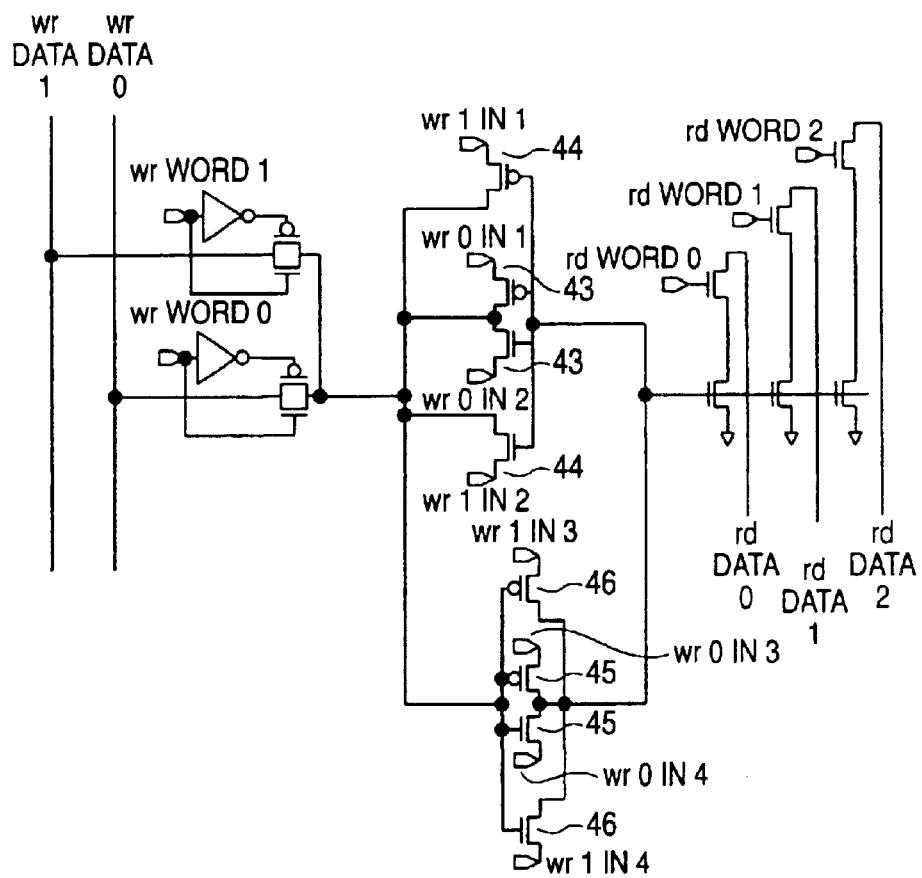
FIG. 18 is a circuit diagram showing the basic structure of a memory cell having multiple ports which can carry out a writing operation at a low voltage according to the embodiment of the invention.

FIG. 18 is a circuit diagram showing the basic structure of a memory cell having two write ports which can carry out a write operation at a low voltage according to the invention as an example of application of this method to a multiport memory cell. In FIG. 18, a memory cell corresponding to a write port 0 is constituted by inverters 43 and 45, a memory cell corresponding to a write port 1 is constituted by inverters 44 and 46, a gate and a drain of a transistor constituting the inverter 43 and the inverter 44 are connected in parallel with each other, and a gate and a drain of a transistor constituting the inverter 45 and the inverter 46 are connected in parallel with each other. Thus, the inverters 43 and 44 and the inverters 45 and 46 serve as the first and second inverters constituting the storage element of a memory cell having two write ports respectively.

Figure 17:
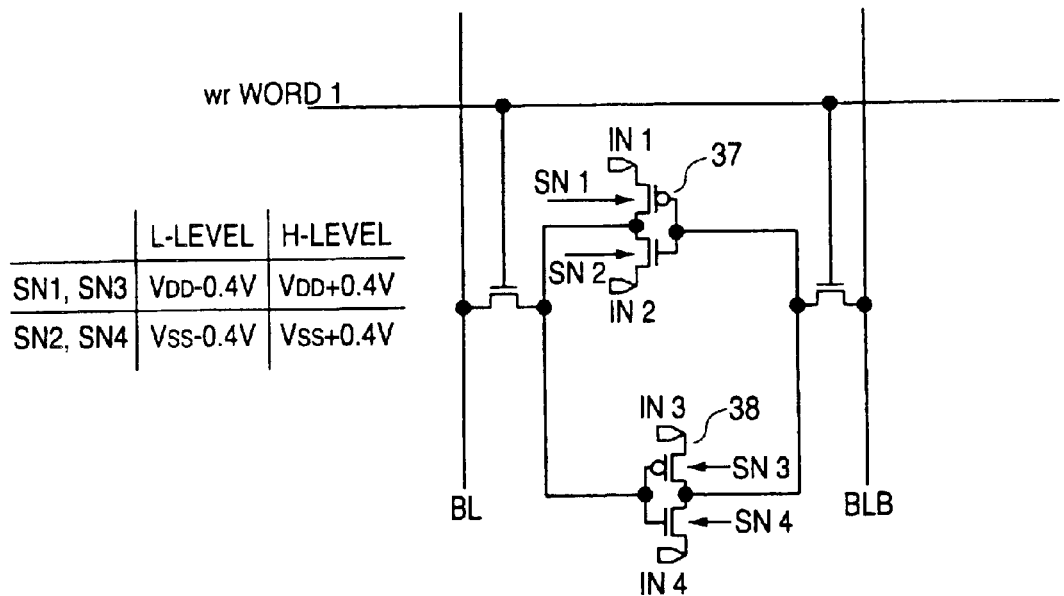
FIGS. 17(a) and 17(b) show the circuit diagrams showing the basic structures of a memory cell capable of carrying out a writing operation at a low voltage according to the embodiment of the invention.
Figure 17:
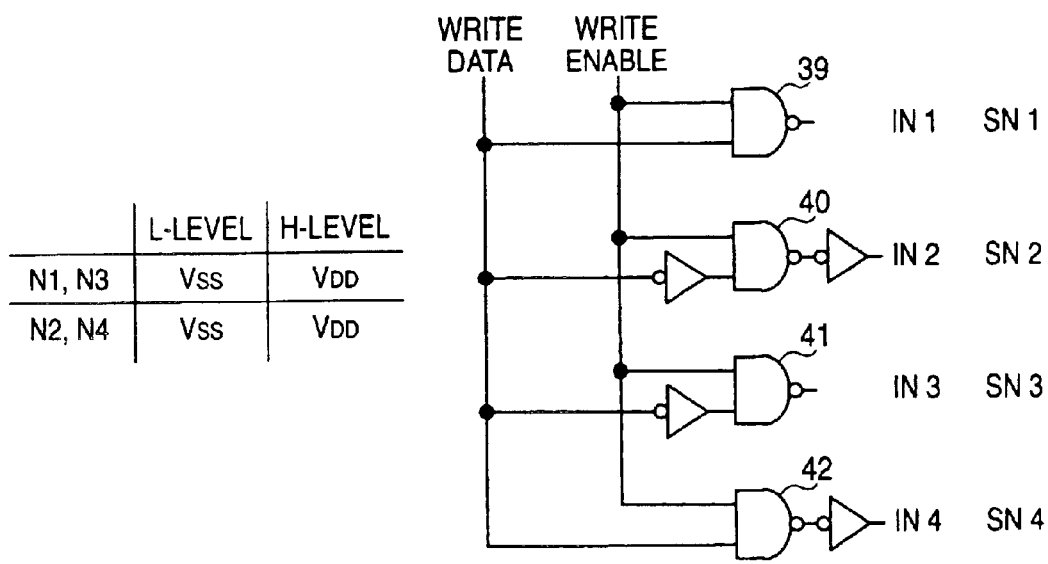

A signal generated from a signal of a write word line and a signal of a write bit line corresponding to the write port 0 by means of the same logic circuit as that of FIG. 17 is sent to sources WR0IN1, WR0IN2, WR0IN3 and WR0IN4 of a transistor constituting the inverters 43 and 45 corresponding to the write port 0, and a signal generated from a signal of a write word line and a signal of a write bit line corresponding to the write port 1 by means of the same logic circuit as that of FIG. 17 is sent to sources WR1IN1, WR1IN2, WR1IN3 and WR1IN4 of a transistor constituting the inverters 44 and 46 corresponding to the write port 1.

Also in the multiport memory cell, thus, the same method as the circuit method shown in FIG. 17 can be implemented. Consequently, it is possible to release the intensity of the feedback of a feedback inverter in the multiport memory cell, and writing can easily be carried out even if a source voltage is dropped.

Figure 24:
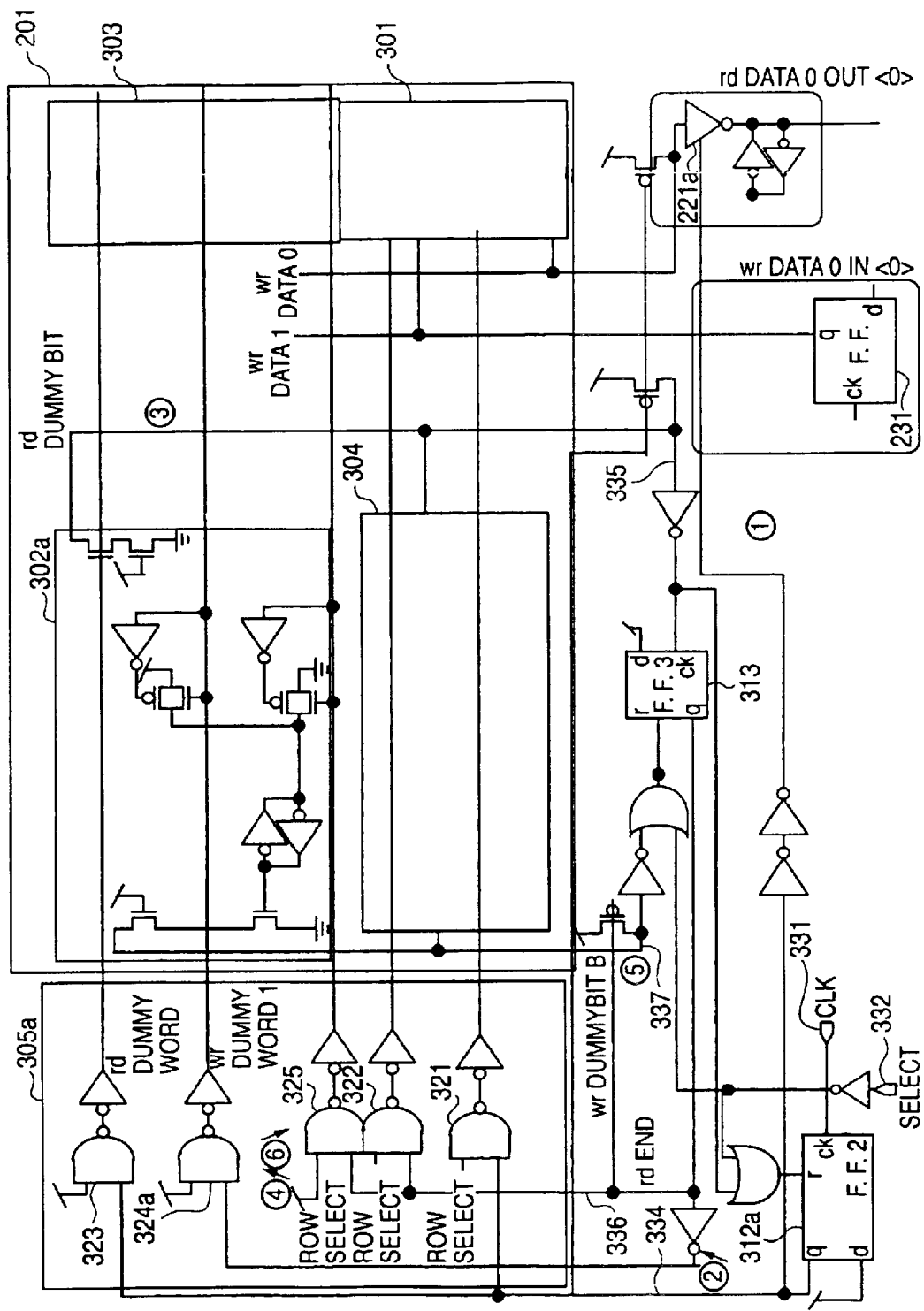
FIG. 24 is a circuit diagram showing an example of a simplified circuit structure for controlling the register file in the memory device according to the first embodiment of the invention.
Figure 26:
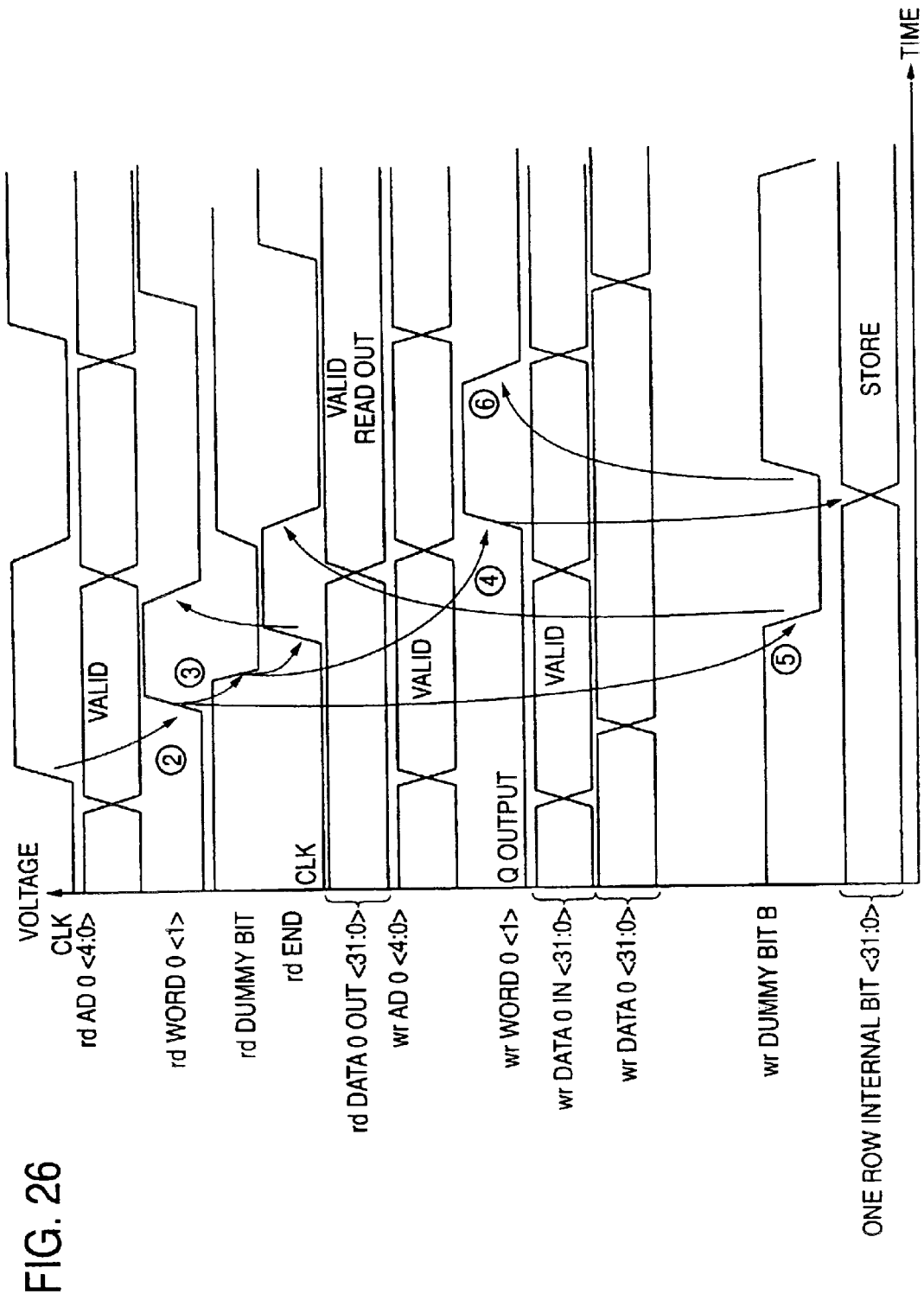
FIG. 26 is a timing chart for explaining an operation in the example of the simplified circuit structure for controlling the register file in the memory device according to the first embodiment of the invention.
Figure 27:
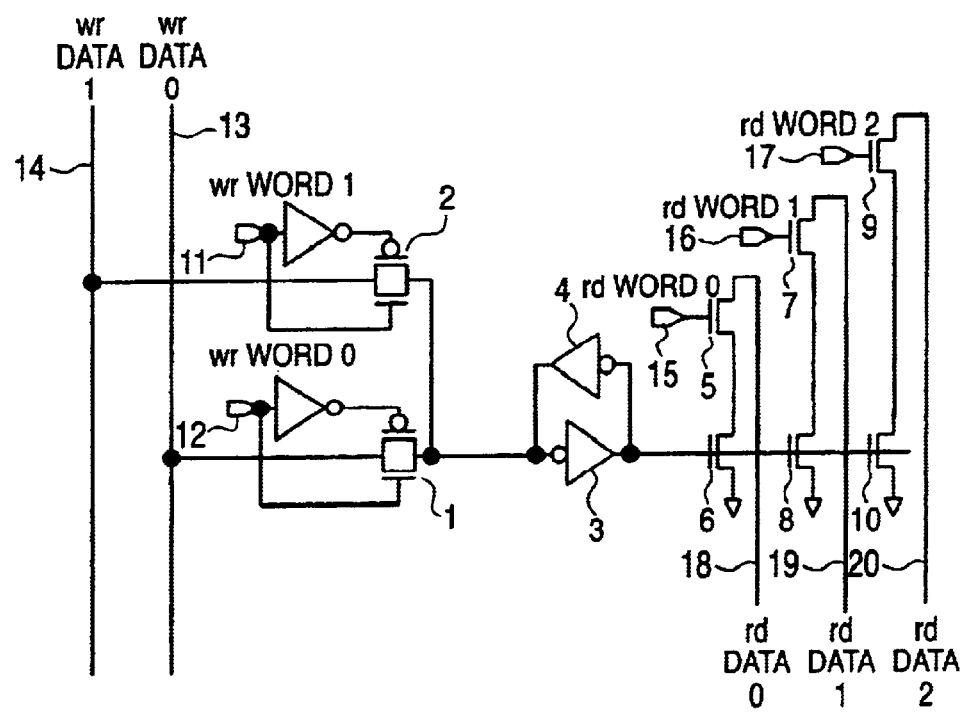
FIG. 27 is a circuit diagram showing an example of the structure of a memory cell in a conventional register file.

In the case in which it is apparent that the write bit line is not critical in the operation of the register file according to the embodiment, that is, the bit line is defined more clearly than the activation of the write word line, the circuit structure shown in FIG. 5 can be simplified. FIG. 24 is a circuit diagram showing an example of the simplified circuit structure for controlling the write and read of the register file constituted as shown in FIGS. 1 and 3, and FIG. 26 is a timing chart for explaining the operation of a control circuit shown in FIG. 24.

Figure 25:
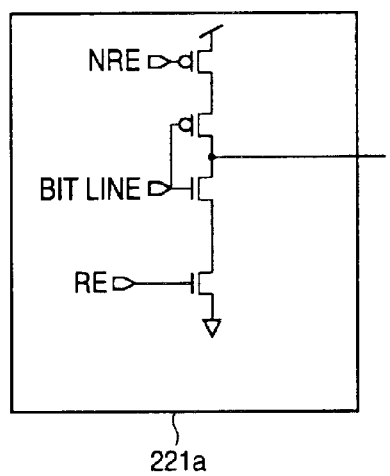
FIGS. 25(a) and 25(b) show the circuit diagrams showing the structure of a read data holding circuit in the example of the simplified circuit structure for controlling the register file in the memory device according to the first embodiment of the invention.
Figure 25:
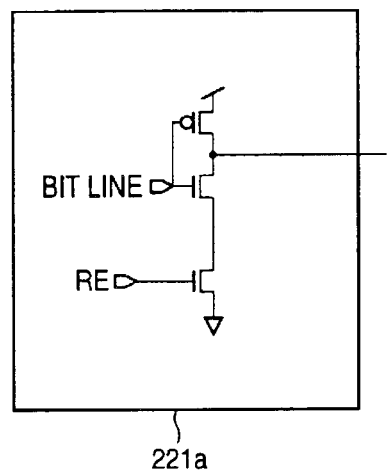

In FIG. 24, the same components as those in the example of the circuit structure shown in FIG. 5 have the same reference numerals. Moreover, components adding a subscript of "a" to the same reference numerals have the same functions in a dummy memory cell A of 302a and indicate a change in the circuit structure, and have the same functions in a flip-flop 312a and a first write dummy row decoder 324a and indicate a change in a connecting relationship. In this case, the write bit line is not critical. Therefore, the flip-flop 311 shown in FIG. 5 is not required. Referring to the write bit line of the dummy memory cell A, first write data are connected to a power supply and second write data are connected to a ground in the memory cell. Furthermore, a reading circuit and a writing circuit are provided. The reading circuit includes a circuit to be switched in response to a control signal changed in the same sequence as that of a read address enable signal. These may be a circuit shown in FIG. 25(a) or a circuit shown in FIG. 25(b) to further increase a speed. Consequently, when the address enable signal is set to have "L", the output of read data is not changed even if a read bit line is precharged.

The flip-flop 312a is started simultaneously with the start of a clock signal CLK so that the read row decoder 321 and the read dummy decoder 323 are activated (○2). When a fixed storage value is output from the dummy memory cell A to the dummy read bit line 335 (○3), the flip-flop 312 is reset and the flip-flop 313 is set. Thus, the read cycle is ended and the write cycle is started (○4).

On the other hand, when the first write dummy row decoder 324a is started in response to an inverted signal of the Q output of the flip-flop 313 in the read cycle, writing is carried out from the power supply in the dummy memory cell A to initialize the write value of the dummy memory cell A and the write cycle is started, the second write dummy row decoder 325 is started in response to the Q output of the flip-flop 313, writing is carried out from a ground in the dummy memory cell A and the change is detected by the dummy write detection signal line 337 so that the write cycle is ended (○6).

In the case in which it is apparent that the write bit line is not critical, thus, the circuit can be simplified with a circuit structure taking the fact into consideration. Consequently, it is possible to obtain an advantage that the area of a semiconductor integrated circuit chip and power consumption can be reduced.

Second Embodiment

Figure 9:
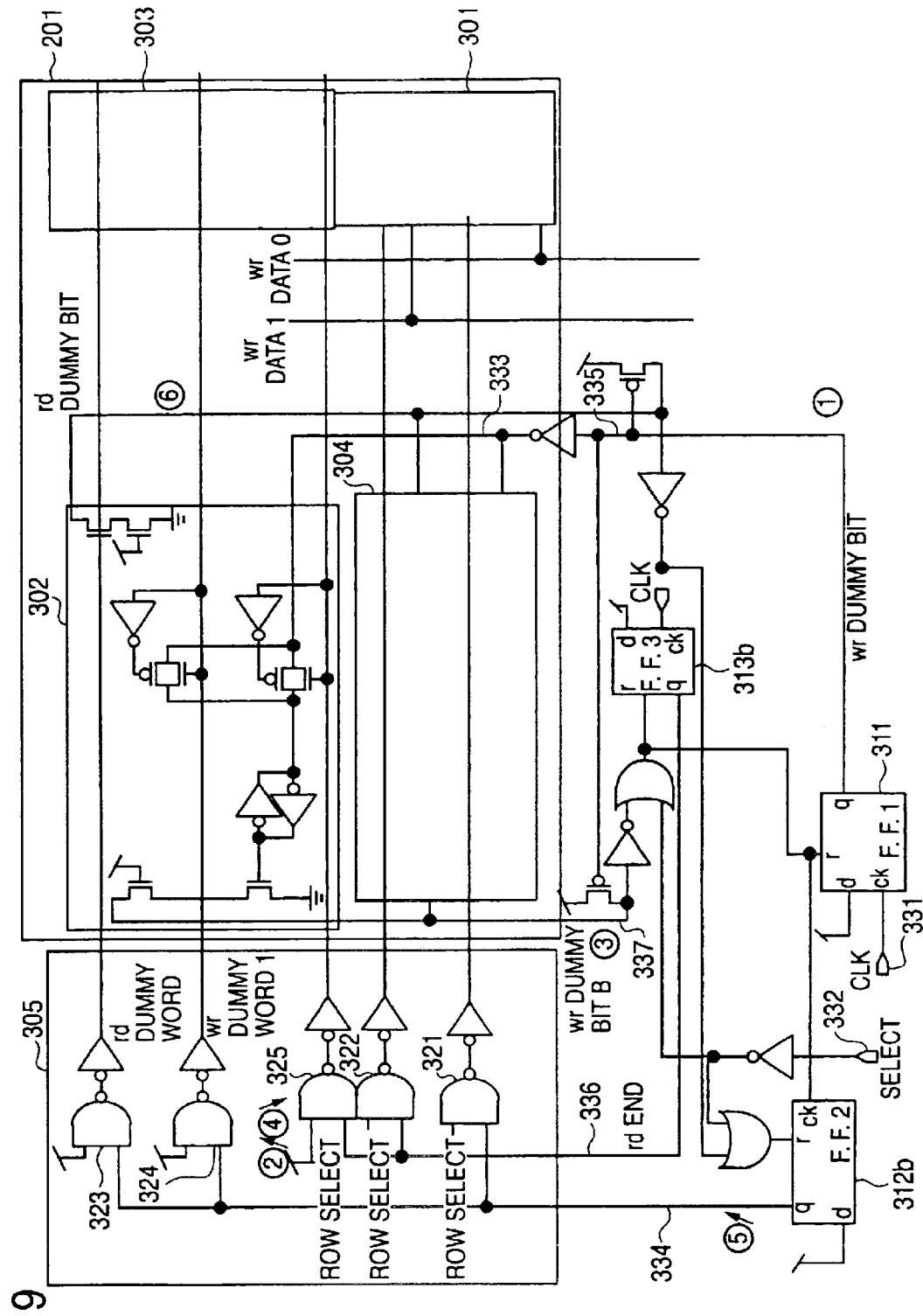
FIG. 9 is a circuit diagram showing an example of a detailed circuit structure for controlling a register file in a memory device according to a second embodiment of the invention.
Figure 10:
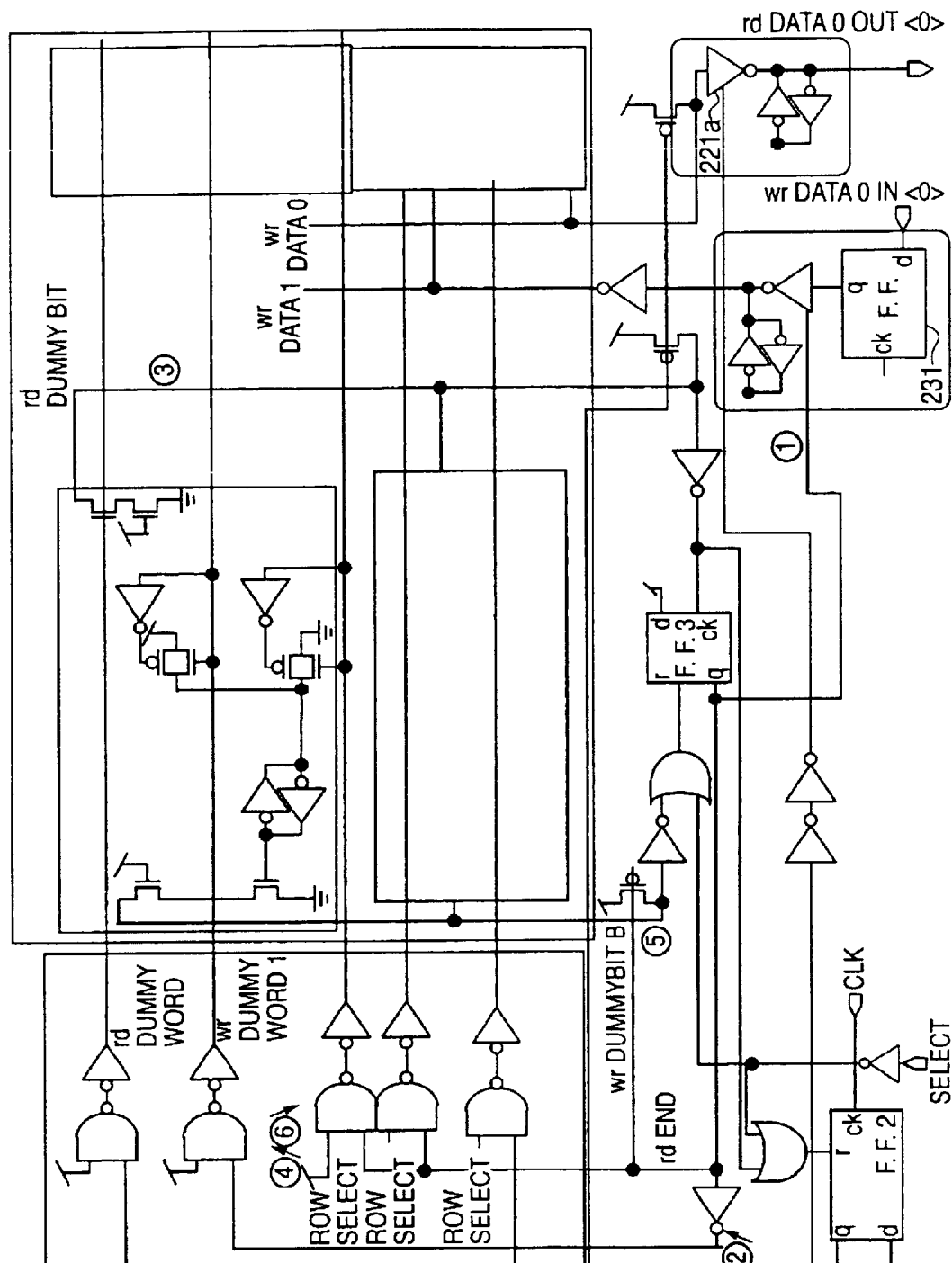
FIG. 10 is a circuit diagram showing an example of a detailed circuit structure for controlling the register file in the memory device according to the second embodiment of the invention.

While there has been described a method of carrying out read and write in a 1-cycle operation synchronously with a clock signal in the first embodiment, it is possible to perform write and read in the 1-cycle operation synchronously with the dock signal in the same manner. FIG. 9 is a circuit diagram showing an example of a detailed circuit structure for controlling write and read according to a second embodiment in a register file constituted as shown in FIGS. 1 and 3. Furthermore, in the case in which write input data are to be transmitted to a write bit line in a multiport memory, it is preferable that a switch to be controlled by a signal line changed in the same sequence as that of a write address enable signal should be inserted between a flip-flop receiving the write input data and a write bit line if the transition overlaps with that of a read bit line. Although a write cycle time is slightly increased, consequently, the interference of the read and write bit lines can be avoided. FIG. 10 is a circuit diagram.

As for the circuitry of FIG. 10, although in each of the write dummy cells the direct connections are made either to the ground or the power source, it is also possible to modify such a direct connection by disposing a resistor in-between whose value is substantial the same as that of the write circuit.

Figure 11:
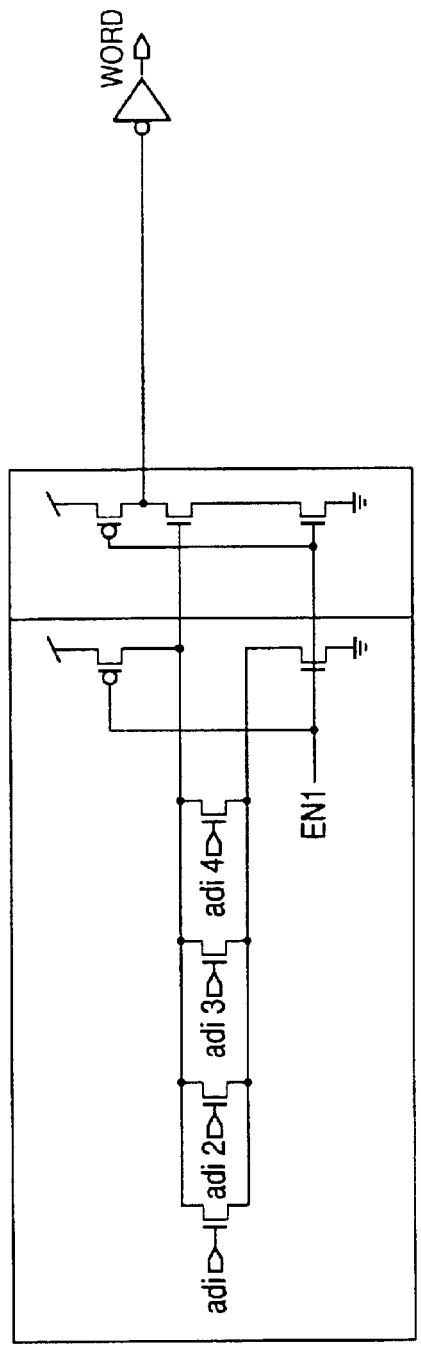
FIGS. 11(a) and 11(b) show the circuit diagrams showing the structures of a row decoder in the register file of the memory device according to the second embodiment of the invention.
Figure 11:
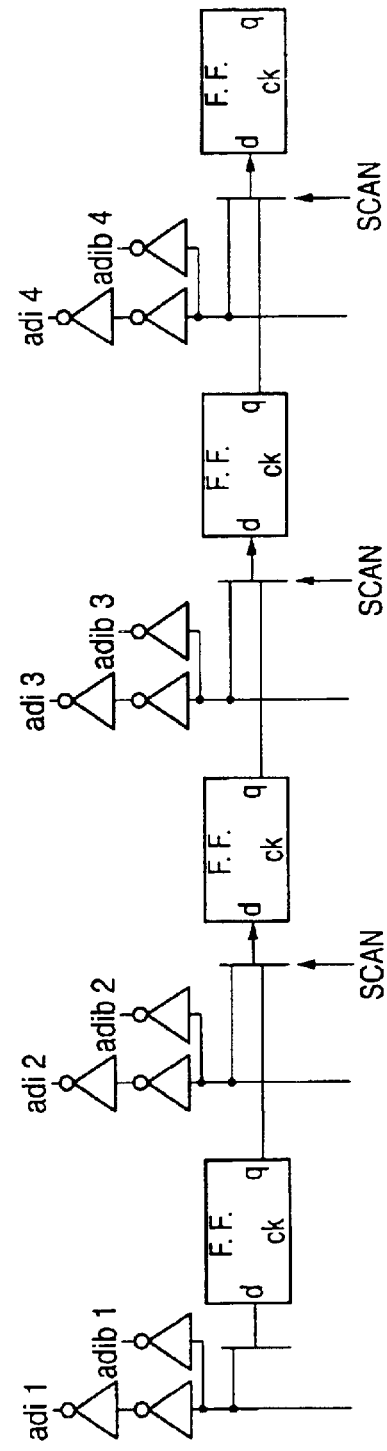

Moreover, description will be given to an example in which a dynamic decoder shown in FIGS. 11(a) and 11(b) is used for a row decoder in order to increase the speed of a reading access. The row decoder does not need to receive an input address by means of a flip-flop or a latch. Therefore, it is possible to correspondingly shorten times required for setting up and holding an address. If the failure of an interface of a multiport memory and another block having an address generated is caused, it is preferable that a flip-flop for a shift register operation should be provided in the diagnosis of the failure. Furthermore, the multiport memory has different operating times for read data and write data. By sharing a section having an address finally decoded with write and read word lines and carrying out switching in response to an address enable signal in a final section as shown in FIGS. 12(a) and 12(b), therefore, it is also possible to reduce the address of an address decoder.

Figure 13:
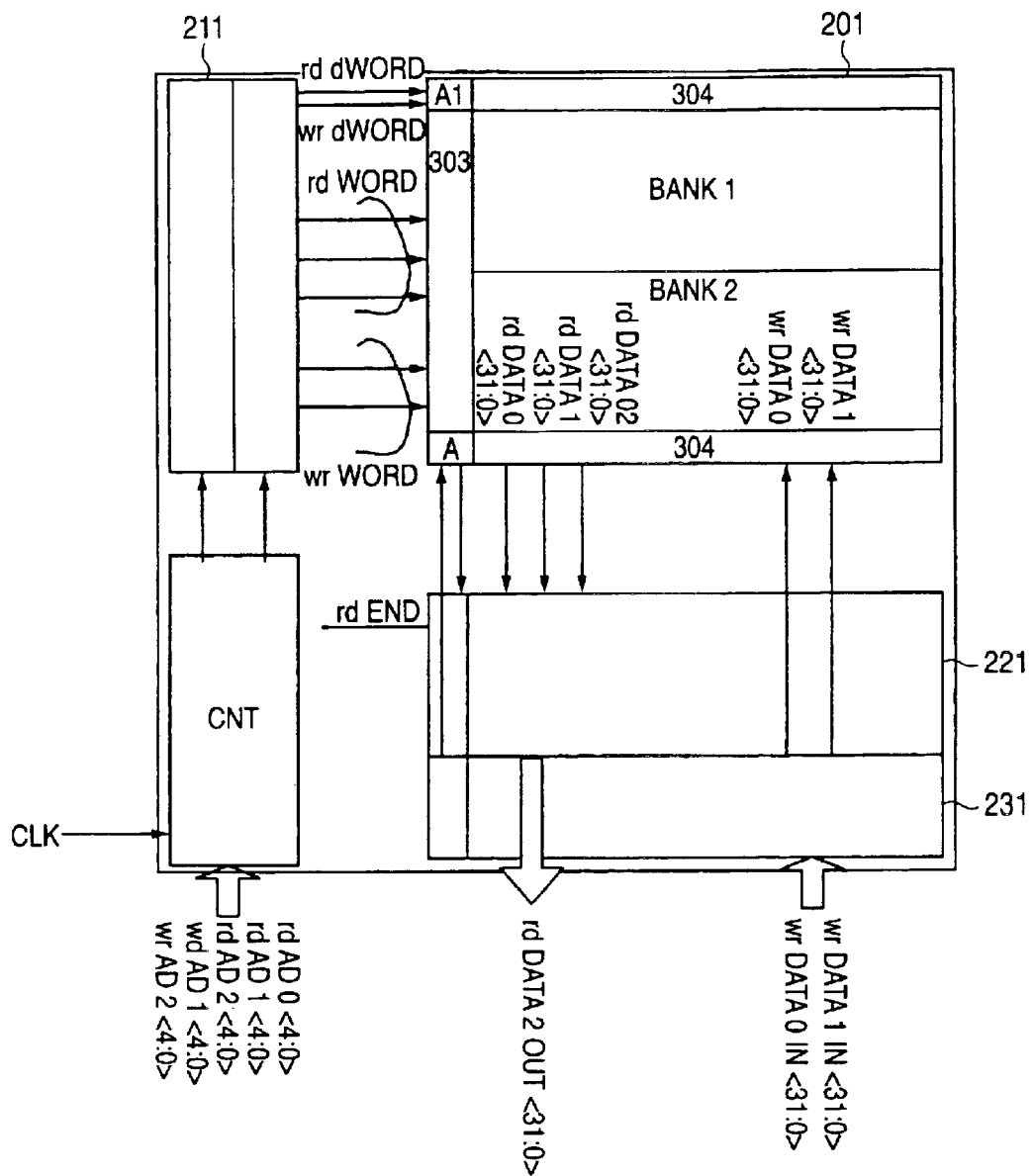
FIG. 13 is a circuit diagram showing an example of a hierarchical memory in which a memory cell array in the register file of the memory device according to the second embodiment of the invention is divided into two parts in a row direction.
Figure 14:
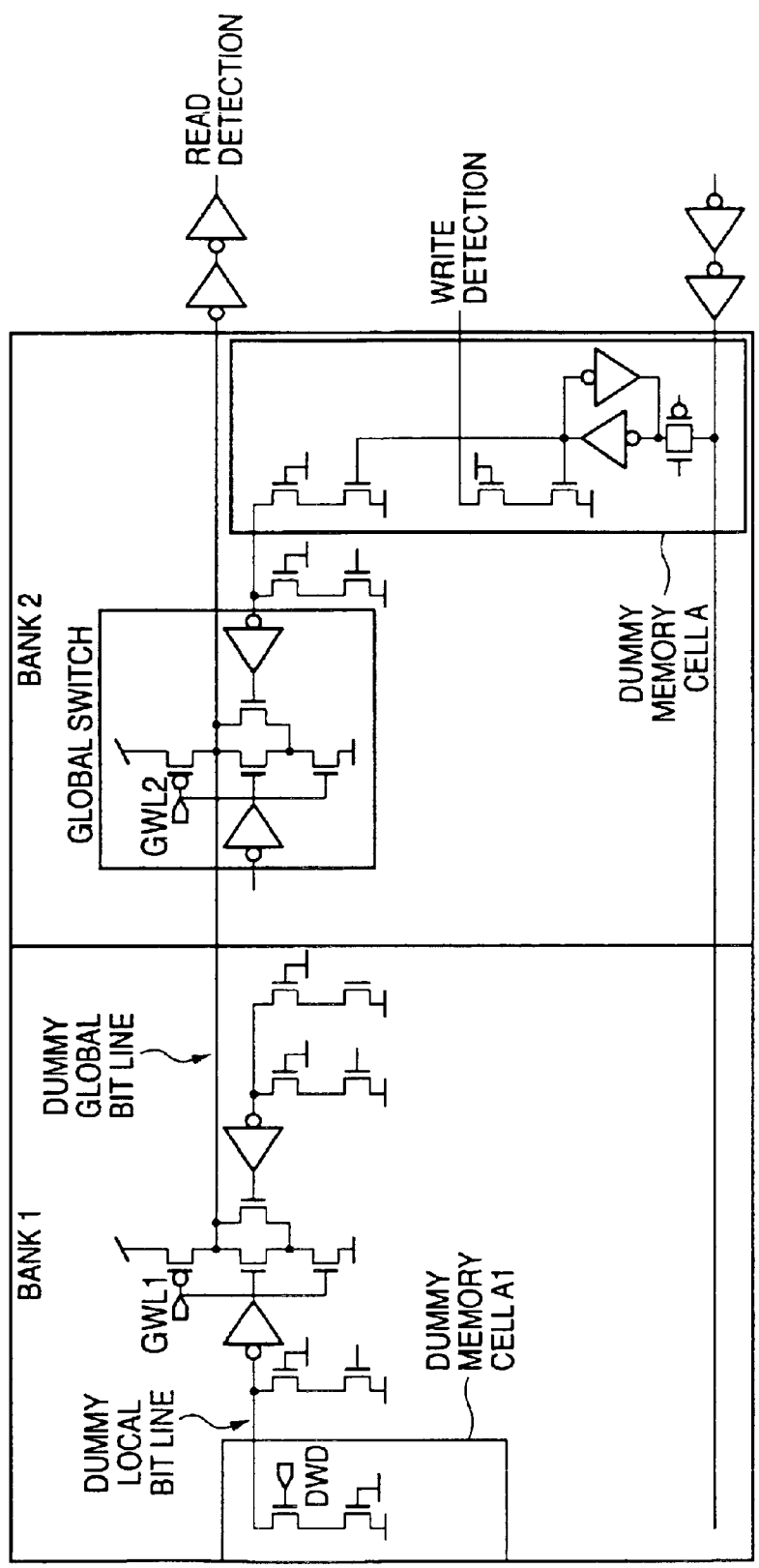
FIG. 14 is a diagram showing the layout of a dummy cell in the register file of the memory device according to the second embodiment of the invention.

In addition, FIG. 13 shows an example of a hierarchical memory in which a memory cell array is divided into two parts (Bank 1 and Bank 2) in a row direction. In this case, the write bit line is not hierarchically divided but the read bit line is hierarchically divided. FIG. 14 shows the layout of a dummy memory cell in such a case. A dummy memory cell A1 serves to compensate for the delay of a reading system and a dummy memory cell A is a circuit for compensating for a write time. A write detection signal is not particularly specified for a wiring and it is desirable that a write bit line and word line, a read local bit line, a read global line and a word line should have the same structures as a structure resulting from an original memory cell.

In FIG. 9, the same components as those in the example of the circuit structure shown in FIG. 5 have the same reference numerals. Moreover, components having a subscript of "b" added to the same reference numerals have the same functions and indicate a change in a connecting relationship. More specifically, FIG. 9 is different from FIG. 5 in that the clock input of a flip-flop 313b is directly connected to a clock signal 331 and a flip-flop 312b is rest in response to the reset signal of the flip-flop 313b.

Figure 15:
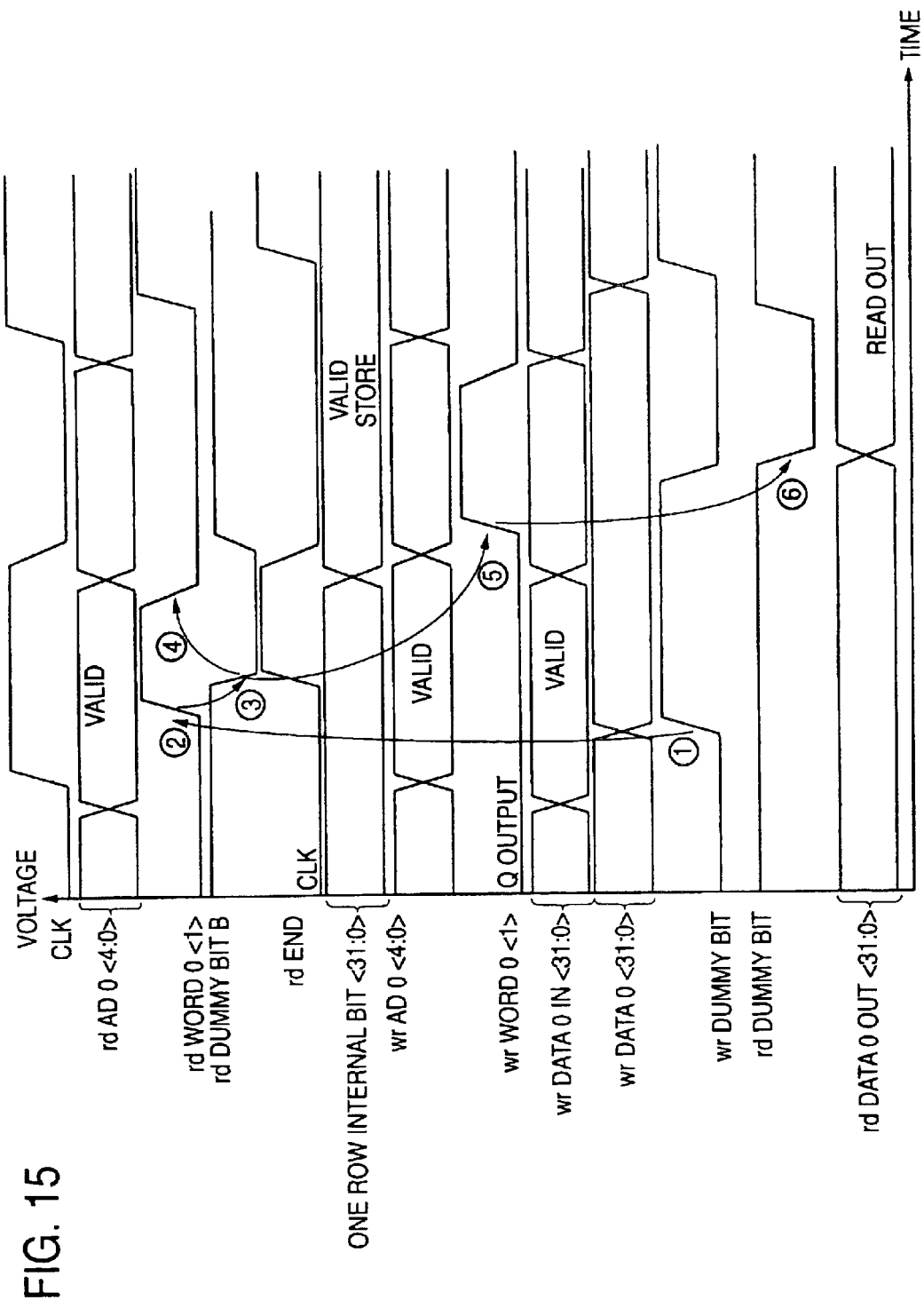
FIG. 15 is a timing chart for explaining the operation of the register file in the memory device according to the second embodiment of the invention.

FIG. 15 is a timing chart for explaining the operation of the control circuit shown in FIG. 9. With reference to FIGS. 8 and 14, description will be given to the operation of the register file comprising a memory cell having multiple ports by the memory device according to the embodiment. In FIGS. 8 and 14, the correspondence relationship between a signal timing and an operating circuit is represented by a numeral in a mark of ○. In the following description, (○ numeral) will be given in the same manner as that in the first embodiment.

In an initial state, first of all, when a select signal is changed from an L level to an H level, the flop-flops 311, 312b and 313b are set in a reset state and a Q output has the L level. Next, when a clock signal CLK is input, the flip-flop 311 and the flip-flop 313b are changed from the L level to the H level (○1). Consequently, a write row decoder 322 and a second write dummy row decoder 325 are started (○2).

Correspondingly, a dummy write value on a dummy write bit line 333 is written to the dummy memory cell A. Next, when the dummy write value is read onto a dummy write detection signal line 337 (○3), the flip-flop 311 and the flip-flop 313b are reset. Consequently, the write row decoder 322 and the second write dummy row decoder 325 are deactivated so that a write cycle is ended (○4).

At the same time, the flip-flop 312b is set (○5) so that a read row decoder 321, a read dummy decoder 323 and a first write dummy row decoder 324 are activated and a read cycle is thus started. Since the flip-flop 311 is reset, an inverted dummy write value is written to the dummy memory cell A so that the write value of the dummy memory cell A is initialized.

Next, when a fixed storage value is output from the dummy memory cell A to a dummy read bit line 335 (○6), the flip-flop 312b is reset by the fixed storage value so that the read row decoder 321 and the read dummy decoder 323 are deactivated. Consequently, the read cycle is ended.

Thus, a 1-cycle operation for write and read is completed. As described above, a read word line and a write word line for a memory cell array 301 are controlled so as not to be activated at the same time. Therefore, a read bit line and a write bit line are not operated at the same time and they are physically arranged alternately in the layout section of a memory cell. Consequently, either of the bit lines functions as a shield. As a result, there is an advantage that an interference is not caused between the bit lines and the malfunction of the read bit line and that of the write bit line can be prevented.

In the embodiment, the same advantages as those of the first embodiment can be obtained by using a memory cell having a circuit structure for initializing the inside of a dummy memory cell shown in FIG. 16 or a memory cell shown in FIGS. 17(a), 17(b) or 17 in which a write operation can be carried out at a low voltage.

While the read word line and the write word line are physically arranged alternately in the layout section of the memory cell and are controlled so as not to be activated at the same time so that it is possible to obtain an advantage that a malfunction can be prevented from being caused by a cross coupling noise between the bit lines in the first and second embodiments described above, description will further be given to a circuit structure for increasing a noise resistance in the memory device according to the invention.

FIGS. 19(a) and 19(b) show the diagrams showing an example of the structure of a memory device for controlling the substrate voltage of an MOSFET according to the embodiment of the invention. FIG. 19(a) is a circuit diagram showing an example of the structure of the memory cell of a register file having two write ports and three read ports as a memory device and FIG. 19(b) is a diagram showing the physical layout of a write word line and a read word line in the memory cell of FIG. 19(a).

In FIGS. 19(a) and 19(b), the same components as those in the example of the circuit structure of the memory device shown in FIGS. 1(a) to 1(d) have the same reference numerals. More specifically, a memory cell is constituted by transfer gates 1 and 2 for inputting write data, a storage element including inverters 3 and 4 for storing data, and NMOS transistors 5 to 10 for reading data from the storage element, and comprises write word lines 11 and 12 for the two ports and read word lines 15 to 17 for the three ports, and furthermore, a P-channel NWELL 22 constituting the memory cell is provided with a signal input line NW.

In the first and second embodiments, the read word line and the write word line for the memory cell array are controlled so as not to be activated at the same time. Therefore, the read word lines 15 to 17 and the write word lines 11 and 12 are physically arranged alternately so that either of the word lines functions as a shield. Consequently, it is possible to obtain an advantage that a cross coupling noise between the word lines can be prevented.

Figure 19:
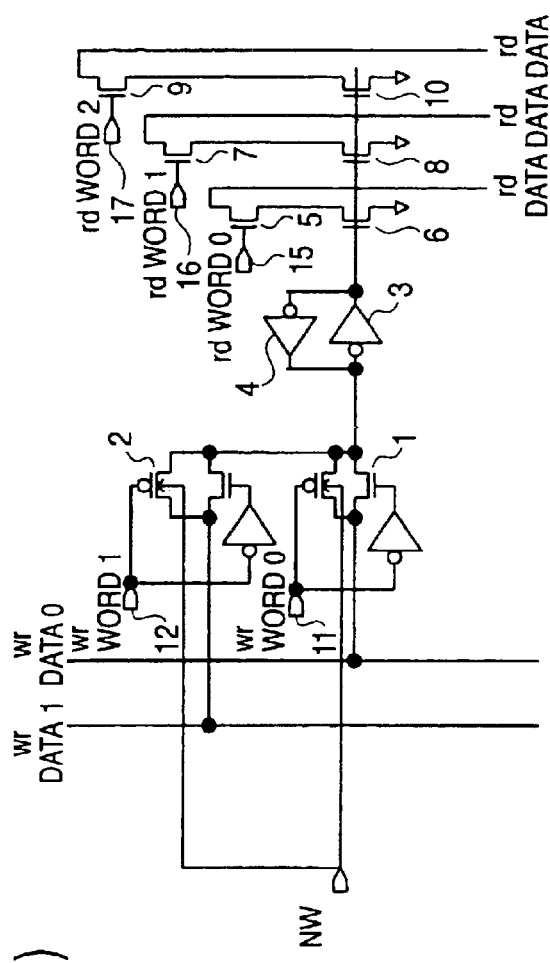
FIGS. 19(a) and 19(b) show the diagrams showing an example of the structure of a memory device for controlling the substrate voltage of an MOSFET according to the embodiment of the invention.
Figure 19:
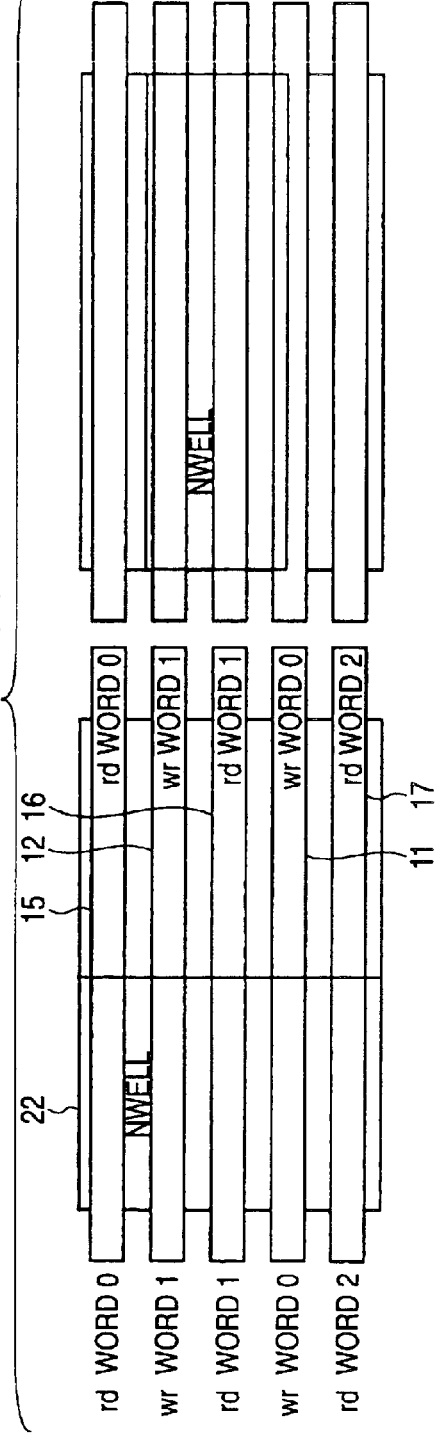

FIG. 20 is a timing chart for explaining the operation of a register file using the memory cell shown in FIG. 19. In FIG. 20, the substrate voltage of the MOSFET which is to be applied to the signal input line NW is raised to be higher than a source voltage while the read word line is activated. As a result, the threshold of a P-channel MOSFET is set to be smaller (−Vth-δV) than a normal value. Usually, a voltage drop is caused by a cross coupling effect over the write word line due to the fall of the read word line. According to the embodiment shown in FIG. 19, however, the threshold is decreased by −δV. Therefore, the noise resistance is more increased by −δV as compared with the case in which there is no processing, and it is possible to obtain an advantage that a write malfunction is caused with difficulty even if a glitch is generated. For convenience of a layout, only the voltage of the transfer gate may be set to be higher than the substrate voltage. In this case, it is preferable that the substrate voltage of an N-channel MOSFET constituting the read port should not be raised in order to maintain a speed.

Figure 21:
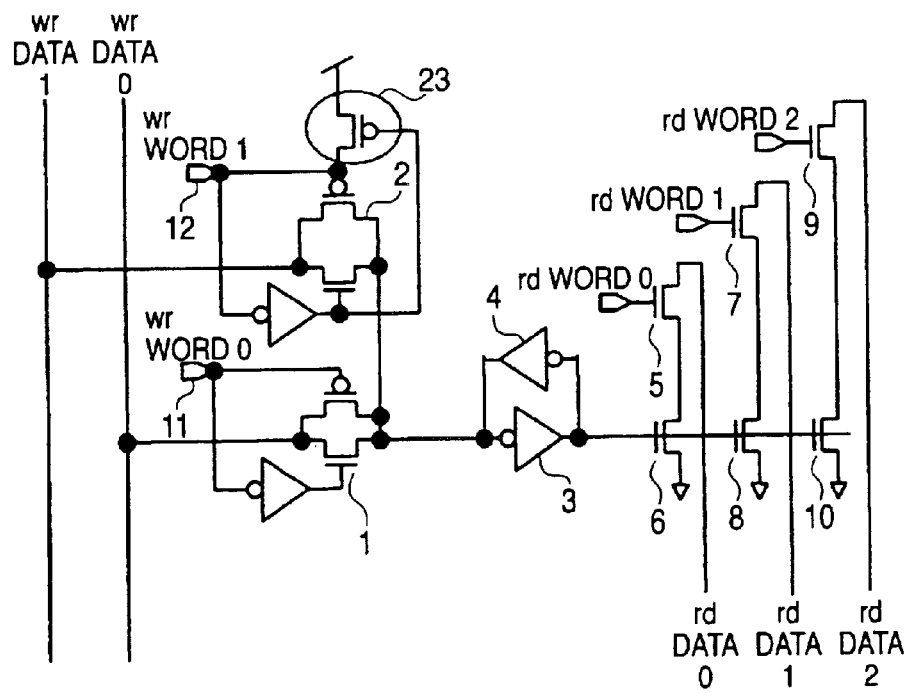
FIG. 21 is a circuit diagram showing an example of the structure of a memory device for controlling the impedance of a control signal according to the embodiment of the invention.

FIG. 21 is a circuit diagram showing an example of the structure of a memory cell having two write ports and three read ports as a memory device for controlling the impedance of a control signal according to the embodiment of the invention.

In FIG. 21, the same components as those in the example of the circuit structure of the memory device shown in FIG. 1 have the same reference numerals. More specifically, a memory cell is constituted by transfer gates 1 and 2 for inputting write data, a storage element including inverters 3 and 4 for storing data, and NMOS transistors 5 to 10 for reading data from the storage element, and comprises write word lines 11 and 12 for the two ports and read word lines 15 to 17 for the three ports, and furthermore, a P-channel MOSFET 23 having a drain and a gate connected to a write word line for controlling the transfer gate and the output of an inverting logic circuit thereof respectively and a source connected to a power supply.

By the P-channel MOSFET 23, when the read word line falls, a current path is generated in a section other than the P-channel MOSFET of the inverter in a final stage of the write row decoder so that the impedance of the write word line is reduced. Consequently, it is possible to obtain an advantage that the ratio of a coupling capacity to the read word line is decreased so that the influence of a cross coupling noise is reduced.

Figure 22:
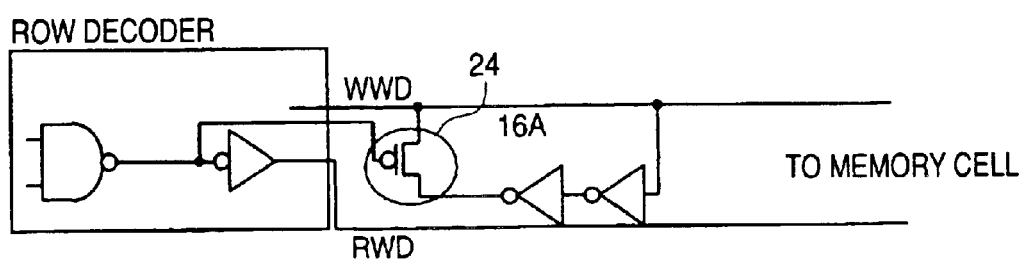
FIG. 22 is a circuit diagram showing an example of the structure of a cross coupling noise removing circuit in the memory device according to the embodiment of the invention.

FIG. 22 is a circuit diagram showing an example of the structure of a cross coupling noise removing circuit in the memory device according to the embodiment of the invention. The cross coupling noise removing circuit in FIG. 22 is provided in the driving source of a word line. In FIG. 22, a P-channel MOSFET 24 has a gate to which the input of a buffer for driving a read word line RWD is connected, a source to which the outputs of inverters in two stages for inputting a write word line WWD, and a drain to which the write word line WWD is connected.

The outputs of the inverters in the two stages for inputting the write word line WWD are connected to the source of the P-channel MOSFET 24 so that an impedance becomes higher than that in the case in which the same outputs are connected to the power supply, resulting in a delay of a transition response speed of a drop in a source voltage due to the coupling of a word line to power line which is caused by the fall of the read word line RWD. Consequently, the voltage value of the source of the P-channel MOSFET 24 can be maintained to be higher and a drop in the source voltage of the driving capability of the P-channel MOSFET 24 can be absorbed. Moreover, the P-channel MOSFET 24 can also serve as an inverting logic circuit for driving the read word line. Thus, the area of a semiconductor integrated circuit chip can be reduced.

Figure 23:
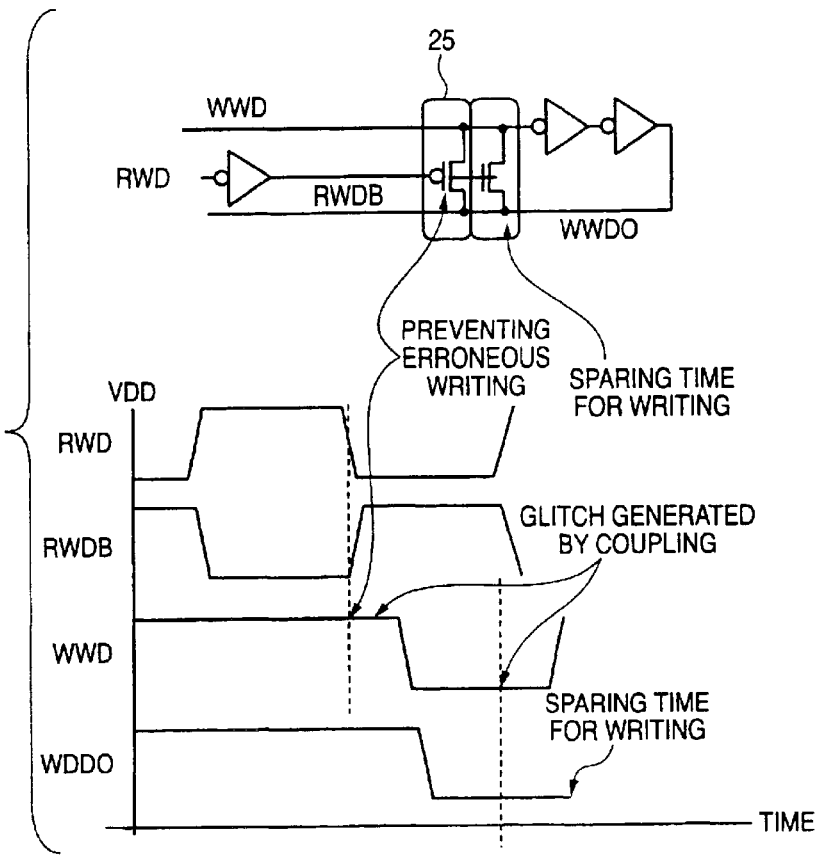
FIG. 23 is a circuit diagram showing an example of the structure of the cross coupling noise removing circuit in the memory device according to the embodiment of the invention.

FIG. 23 is a circuit diagram showing an example of another structure of the cross coupling noise removing circuit in the memory device according to the embodiment of the invention. The cross coupling noise removing circuit shown in FIG. 23 is provided in the middle or end point of the word line. In FIG. 23, the P-channel MOSFET 25 has a gate to which the output of an inverter for inputting a read word line RWD is connected, a source to which the outputs of inverters in two stages for inputting a write word line WWD are connected, and a drain to which the write word line WWD is connected.

This circuit is provided in the middle or end point of the word line. Even if the read word line falls, consequently, WWD is maintained to be VDD by a time corresponding to the delay of the inverter and a cross coupling noise is generated in the write word line by the read word line RWD with difficulty. Thus, erroneous writing can be prevented. As described above, according to the invention, it is possible to obtain an excellent advantage that the read word line and the write word line for the memory cell array are controlled so as not to be activated at the same time so that the simultaneous operations of the read bit line and the write bit line can be avoided, and the read word line and the write word line are physically arranged alternately in the layout section of the memory cell so that the bit line can be caused to function as a shield and the malfunction of the read bit line and that of the write bit line can be prevented from being caused by a cross coupling noise between the bit lines.

According to the invention, furthermore, the dummy memory cell is constituted by using the transistor having the same shape as that of the memory cell and the circuit is constituted in such a manner that the load characteristics of the signal lines are also identical to each other. Consequently, the operating characteristic of each signal line in the dummy memory cell can be caused to be coincident with that of the memory cell without depending on a variation in a process, a fluctuation in a temperature or a change in a voltage. By constituting read and write control systems using the dummy memory cell, therefore, it is possible to obtain an excellent advantage that the memory device can be efficiently operated autonomously synchronously with a clock signal and the read word line and the write word line can also be controlled reliably so as not to be activated at the same time.

According to the invention, moreover, the substrate voltage of the MOSFET constituting the storage element in the memory cell is raised so that the threshold is controlled or the impedance of the write control signal is controlled. Consequently, it is possible to reduce the cross coupling noise in the write word line by the fall of the read word line. Thus, it is possible to obtain an excellent advantage that the malfunction of write can be prevented.

According to the invention, furthermore, there is employed a circuit structure for sending a reset signal to the storage element in the memory cell. Consequently, it is possible to initialize the storage element in the memory cell within one cycle also in the case in which the write word line is deactivated. By employing such a structure, it is possible to obtain an excellent advantage that the physical shapes of another memory cell and a transistor can be shared and a deterioration in performance can be prevented by using mask data which can be compromised to some extent.

According to the invention, moreover, the respective sources of the transistors of two inverting logic gates constituting the storage element in the memory cell are controlled in response to a write signal and an inverted signal thereof in response to a write control signal. Even if a source voltage is dropped, consequently, writing can easily be carried out. Thus, it is possible to reduce the voltage of the memory device. Furthermore, plural sets of inverting logic gates are connected in parallel with each other to constitute the same circuit. Thus, it is possible to obtain an excellent advantage that the voltage of the memory device can also be reduced in a memory device having multiple ports.

What is claimed is:

1. A memory device comprising at least one read control signal line for transmitting a read control signal to a memory cell, at least one read signal line for transmitting information of the memory cell to an outside according to activation of the read control signal corresponding to the read control signal line, at least one write control signal line for transmitting a write control signal to the memory cell, and at least one write signal line for transmitting external information to the memory cell according to activation of the write control signal corresponding to the write control signal line, wherein the read signal line and the write signal line are alternately provided and the read control signal and the write control signal are controlled so as not to be activated at the same time.

2. The memory device according to claim 1, wherein the write control signal is activated after it is detected that the information of the memory cell is transmitted to the outside according to the activation of the read control signal.

3. The memory device according to claim 1, wherein the read control signal is deactivated after it is detected that the information of the memory cell is transmitted to the outside according to the activation of the read control signal.

4. The memory device according to claim 2 or 3, further comprising a dummy memory cell constituted by using a semiconductor element having the same shape as that of a semiconductor element forming the memory cell and having a circuit structure including a dummy read control signal line and a dummy read signal line having the same load characteristics as those of the read control signal line and the read signal line respectively, the dummy memory cell outputting, to the dummy read signal line, a fixed storage value according to the activation of the read control signal given to the dummy read control signal line and the transmission of the information of the memory cell to the outside being detected by detection of the fixed storage value in the dummy read signal line.

5. The memory device according to claim 4, further comprising a dummy memory cell constituted by using a semiconductor element having the same shape as that of a semiconductor element forming the memory cell and having a circuit structure including a first dummy write control signal line having the same load characteristic as that of the write control signal line and serving to receive the read control signal, a second dummy write control signal line having the same load characteristic as that of the write control signal line and serving to receive the write control signal, a dummy write signal line having the same load characteristic as that of the write signal line and serving to receive a dummy write value, and a dummy write detection signal line having the same load characteristic as that of the read signal line, the dummy write value being written to the dummy memory cell corresponding to the activation of the read control signal, the dummy write value being inverted when it is detected that the dummy write value written to the dummy memory cell is output to the dummy write detection signal line, and the inverted dummy write value being written to the dummy memory cell according to the activation of the write control signal.

6. The memory device according to claim 5, wherein the write control signal is deactivated after it is detected that the dummy write value written to the dummy memory cell is output to the dummy write detection signal line.

7. The memory device according to claim 6, wherein the dummy write value is given synchronously with a clock signal and the read control signal is then activated, thereby repeating a series of operations for writing the dummy write value to the dummy memory cell, reading a fixed storage value from the dummy memory cell, deactivating the read control signal, activating the write control signal, inverting the dummy write value by the detection of the output of the dummy write value written to the dummy memory cell, writing the inverted dummy write value to the dummy memory cell, and deactivating the write control signal.

8. The memory device according to claim 1, wherein the read control signal is activated after it is detected that the external information is transmitted to the memory cell according to the activation of the write control signal.

9. The memory device according to claim 1, wherein the write control signal is deactivated after it is detected that the external information is transmitted to the memory cell according to the activation of the write control signal.

10. The memory device according to claim 8 or 9, further comprising a dummy memory cell constituted by using a semiconductor element having the same shape as that of a semiconductor element forming the memory cell and having a circuit structure including a first dummy write control signal line, having the same load characteristic as that of the write control signal line and serving to receive the read control signal, a second dummy write control signal line having the same load characteristic as that of the write control signal line and serving to receive the write control signal, a dummy write signal line having the same load characteristic as that of the write signal line and serving to receive a dummy write value, and a dummy write detection signal line having the same load characteristic as that of the read signal line, the dummy write value being written to the dummy memory cell according to the activation of the write control signal and the detection of the transmission of the external information to the memory cell depending on detection of output, to the dummy write detection signal line, of the dummy write value written to the dummy memory cell.

11. The memory device according to claim 10, wherein the dummy write value is inverted by the detection of the output, to the dummy write detection signal line, of the dummy write value written to the dummy memory cell, and the inverted dummy write value is written to the dummy memory cell according to the activation of the read control signal.

12. The memory device according to claim 10, further comprising a dummy memory cell constituted by using a semiconductor element having the same shape as that of a semiconductor element forming the memory cell and having a circuit structure including a dummy read control signal line and a dummy read signal line having the same load characteristics as those of the read control signal line and the read signal line respectively, the dummy memory cell outputting, to the dummy read signal line, a fixed storage value according to the activation of the read control signal given to the dummy read control signal line and the read control signal being deactivated by detection of the fixed storage value in the dummy read signal line.

13. The memory device according to claim 12, wherein the dummy write value is given synchronously with a clock signal and the write control signal is then activated, thereby repeating a series of operations for writing the dummy write value to the dummy memory cell, inverting the dummy write value by the detection of the written dummy write value in an output of the dummy memory cell, deactivating the write control signal, activating the read control signal, writing the inverted dummy write value to the dummy memory cell, reading the fixed storage value from the dummy memory cell, and deactivating the read control signal.

14. The memory device according to claim 1, wherein the read control signal line and the write control signal line are provided as alternately as possible.

15. The memory device according to claim 1, wherein an absolute value of a substrate voltage of an MOSFET constituting a storage element in the memory cell is set to be greater than that of a signal voltage to be applied to the storage element at time of the activation of the read control signal.

16. The memory device according to claim 1, wherein an absolute value of a substrate voltage of a transfer gate in the memory cell is set to be greater than that of a signal voltage to be applied to a storage element at time of the activation of the read control signal.

17. The memory device according to claim 16, wherein a substrate voltage of a P-channel MOSFET of the transfer gate is raised.

18. The memory device according to claim 17, wherein a write control circuit for writing information to the memory cell in response to the write control signal includes an MOSFET which is constituted by a switch of the transfer gate having an inverting logic circuit to be controlled in response to the write control signal, and has a gate connected to an output of the inverting logic circuit, a drain connected to the write control signal line, and a source connected to a power supply or a ground.

19. The memory device according to claim 1, wherein a driving source of the write control signal line is provided with an MOSFET having a gate connected to an input of an inverting logic gate for driving the read control signal line, a source connected to an output of a normal logic gate for inputting the write control signal, and a drain connected to the write control signal line.

20. The memory device according to claim 1, wherein an MOSFET having a gate connected to an output of an inverting logic gate for inputting the read control signal, a source connected to the output of the normal logic gate for inputting the write control signal and a drain connected to the write control signal line is provided in a middle section or an end of the write control signal line.

21. A memory device wherein a storage element in a memory cell is constituted by first and second inverting logic gates, a reset signal line is connected to a first source of the first inverting logic gate, a reset signal to be sent to the reset signal line is fixed to be inactive during a reading and writing operation of the memory cell, and the reset signal is activated to set a state of the storage element to have a desirable value for a period other than the reading and writing operation.

22. The memory device according to claim 21, wherein when a first source and a second source of the second inverting logic gate are to correspond to the first source and a second source of the first inverting logic gate, an inverting reset signal line for sending an inverted reset signal is connected to the second source of the second inverting logic gate.

23. The memory device according to claim 21, wherein the reset signal is activated in response to a signal indicative of completion of write to the memory cell.

24. A memory device wherein a storage element in a memory cell is constituted by first and second inverting logic gates, a NOT signal of AND of a write control signal and a write signal is connected to a first source of a transistor constituting the first inverting logic gate, an AND signal of a write control signal and an inverted write signal is connected to a second source of the transistor constituting the first inverting logic gate, a NOT signal of AND of the write control signal and the inverted write signal is connected to a first source of a transistor constituting the second inverting logic gate, and an AND signal of the write control signal and the write signal is connected to a second source of the transistor constituting the second inverting logic gate.

25. The memory device according to claim 24, wherein there is provided a combination of the write control signals and the write signals, the storage element in the memory cell is constituted by using a combination of two inverting logic gates of which number is equal to the number of the write control signals and which are caused to correspond to the write control signals, gates and drains of the transistors constituting the respective inverting logic gates have corresponding points connected in parallel with each other, and the sources of the transistors constituting the respective inverting logic gates are connected to signals generated by the write control signal and the write signal which correspond to the respective inverting logic gates.

* * * * *